(12) United States Patent
Nishimura et al.

(10) Patent No.: US 12,348,681 B2
(45) Date of Patent: Jul. 1, 2025

(54) IMAGING DEVICE AND CONTROL METHOD

(71) Applicant: Panasonic Intellectual Property Management Co., Ltd., Osaka (JP)

(72) Inventors: Kazuko Nishimura, Kyoto (JP); Yuya Ito, Kyoto (JP); Yasuo Miyake, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 64 days.

(21) Appl. No.: 17/660,829

(22) Filed: Apr. 26, 2022

(65) Prior Publication Data
US 2022/0256106 A1 Aug. 11, 2022

Related U.S. Application Data

(63) Continuation of application No. PCT/JP2020/032206, filed on Aug. 26, 2020.

(30) Foreign Application Priority Data
Nov. 29, 2019 (JP) ................................ 2019-216966

(51) Int. Cl.
*H04N 25/65* (2023.01)
*H04N 25/40* (2023.01)
(Continued)

(52) U.S. Cl.
CPC ............. *H04N 25/65* (2023.01); *H04N 25/40* (2023.01); *H04N 25/50* (2023.01);
(Continued)

(58) Field of Classification Search
CPC ........ H04N 25/65; H04N 25/40; H04N 25/50; H04N 25/63; H04N 25/77; H04N 25/60;
(Continued)

(56) References Cited

U.S. PATENT DOCUMENTS

2006/0077282 A1* 4/2006 Kido ................. H04N 23/72
   348/E5.08
2008/0018761 A1 1/2008 Kondo et al.
(Continued)

FOREIGN PATENT DOCUMENTS

JP 2001-177084 6/2001
JP 2008-028516 2/2008
(Continued)

OTHER PUBLICATIONS

The EPC Office Action dated Dec. 13, 2022 for the related European Patent Application No. 20894775.4.
(Continued)

*Primary Examiner* — Albert H Cutler
(74) *Attorney, Agent, or Firm* — Rimon P.C.

(57) ABSTRACT

An imaging device includes: a plurality of pixels arrayed in a matrix, the plurality of pixels respectively including photoelectric converters that convert light into signal charge and charge accumulators that accumulate the signal charge; and a control circuit. The control circuit causes pixels included in the plurality of pixels and belonging to at least one row to sequentially perform, for each row or for two or more rows at a time, a reset operation for initializing potentials of the charge accumulators, before receiving a trigger signal for giving an instruction for starting exposure, and causes, after receiving the trigger signal, the plurality of pixels to simultaneously perform an exposure operation for accumulating the signal charge in the charge accumulators without causing the pixels included in the plurality of pixels and belonging to at least one row to perform the reset operation.

20 Claims, 13 Drawing Sheets

(51) Int. Cl.
  *H04N 25/50* (2023.01)
  *H04N 25/532* (2023.01)
  *H04N 25/63* (2023.01)
  *H04N 25/76* (2023.01)
  *H04N 25/77* (2023.01)
  *H10K 39/32* (2023.01)

(52) U.S. Cl.
  CPC ........... *H04N 25/532* (2023.01); *H04N 25/63* (2023.01); *H04N 25/77* (2023.01); *H04N 25/7795* (2023.01); *H10K 39/32* (2023.02)

(58) Field of Classification Search
  CPC ...... H04N 25/745; H04N 25/76; H04N 25/53; H04N 25/616; H04N 25/531; H04N 25/532; H04N 25/779; H04N 25/7795; H10K 39/32; H01L 27/146; H01L 27/14665
  See application file for complete search history.

(56) References Cited

U.S. PATENT DOCUMENTS

| | | | | |
|---|---|---|---|---|
| 2010/0271518 | A1* | 10/2010 | Kobayashi | H04N 25/65 348/E5.091 |
| 2015/0288898 | A1* | 10/2015 | Yazawa | H04N 25/65 348/300 |
| 2015/0293238 | A1* | 10/2015 | Iwashita | H04N 5/3205 378/62 |
| 2016/0190187 | A1* | 6/2016 | Nishimura | H04N 25/75 257/292 |
| 2017/0214872 | A1 | 7/2017 | Yanagida et al. | |
| 2018/0020171 | A1 | 1/2018 | Miyake et al. | |
| 2020/0014859 | A1 | 1/2020 | Masuda et al. | |

FOREIGN PATENT DOCUMENTS

| | | |
|---|---|---|
| JP | 2010-129705 | 6/2010 |
| JP | 2010-166159 | 7/2010 |
| JP | 2010-258682 | 11/2010 |
| JP | 2014-078870 | 5/2014 |
| JP | 2017-130872 | 7/2017 |
| WO | 2018/173597 | 9/2018 |

OTHER PUBLICATIONS

International Search Report of PCT application No. PCT/JP2020/032206 dated Nov. 17, 2020.

* cited by examiner

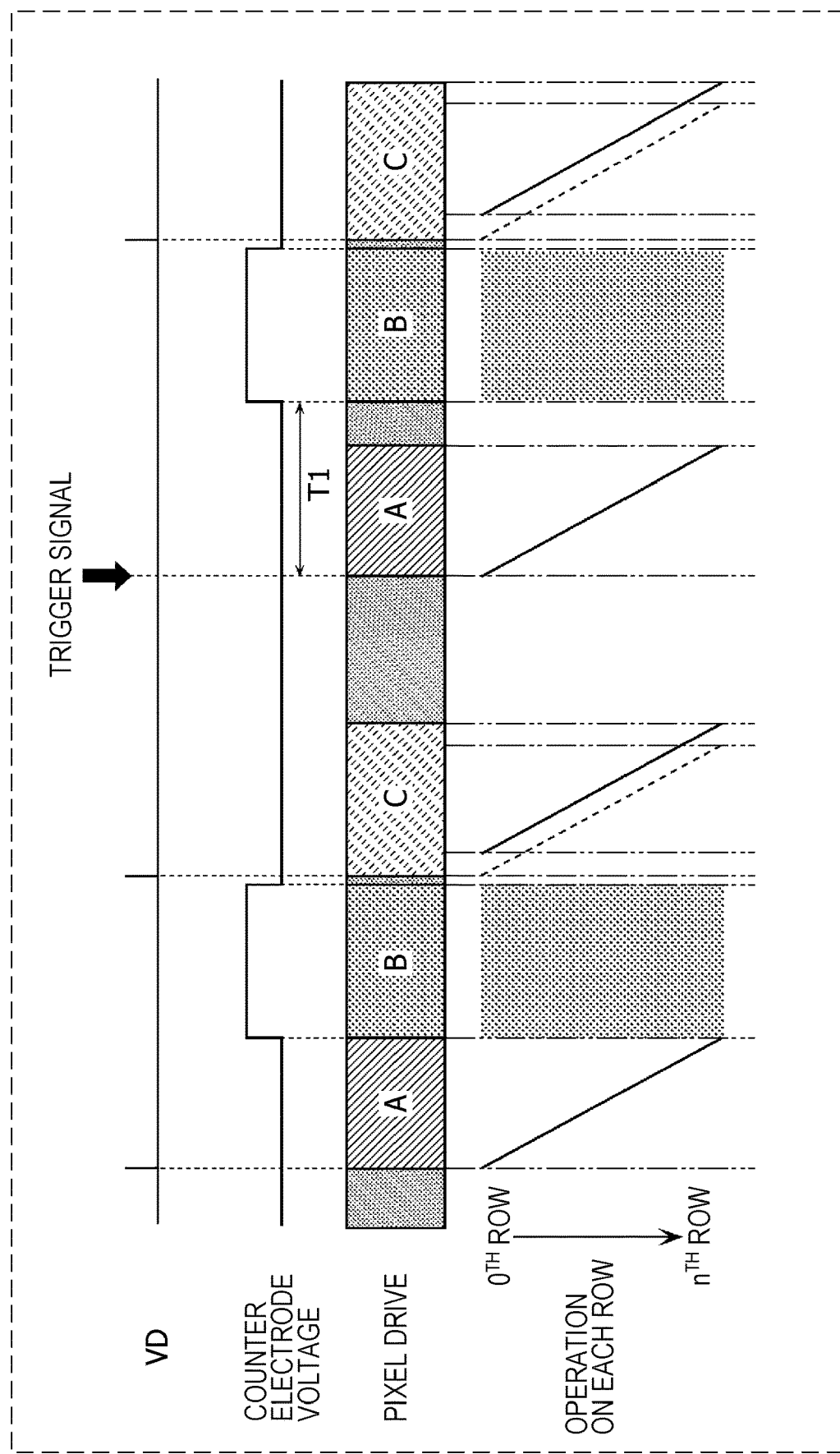

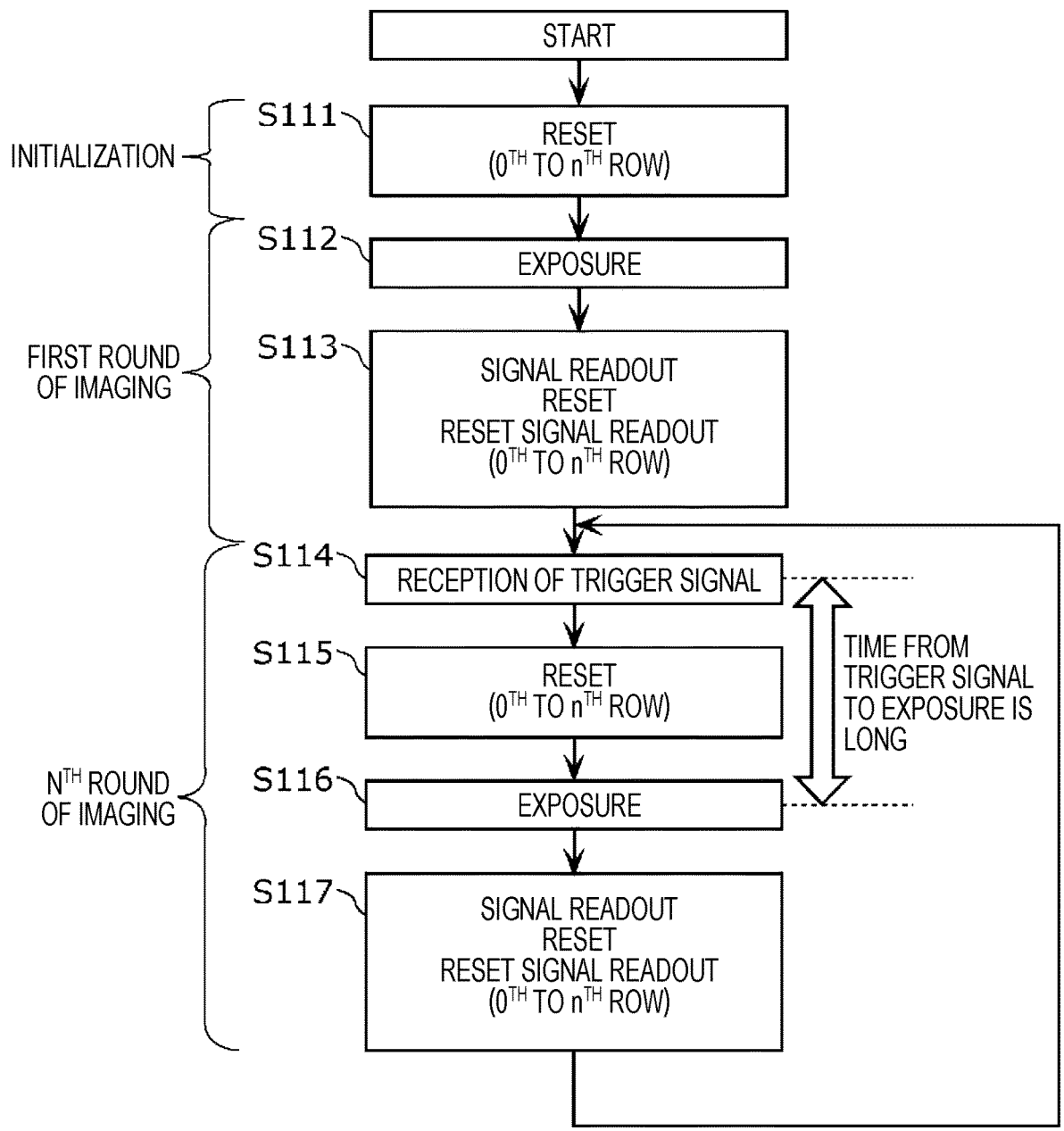

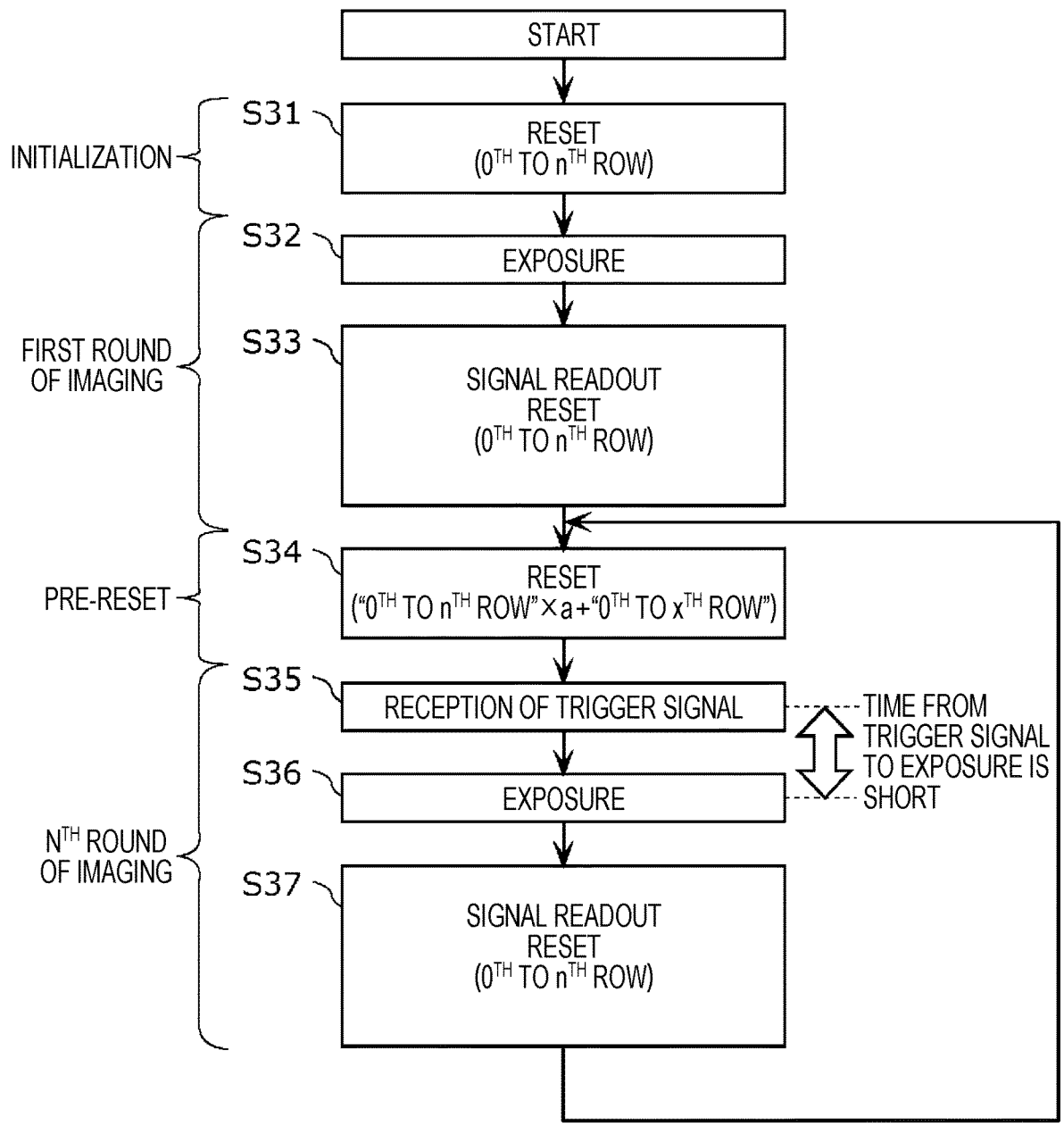

IMAGING DEVICE AND CONTROL METHOD

BACKGROUND

1. Technical Field

The present disclosure relates to an imaging device and so on including a photoelectric converting portion that generates charge upon being illuminated with light.

2. Description of the Related Art

In recent years, digital cameras, such as video cameras, digital still cameras, surveillance cameras, and vehicle-mounted cameras, have been widely used in various fields. In the digital cameras, charge-coupled device (CCD) solid-state imaging elements or complementary metal-oxide semiconductor (CMOS) solid-state imaging elements are used, and of these elements, the CMOS solid-state imaging elements are mainly used. This is because the CMOS solid-state imaging elements have many advantages. For example, since the CMOS solid-state imaging elements can be manufactured in general-purpose CMOS processes, thus can utilize already available facilities, and can be supplied stably, and since peripheral circuitry can be mixed in the same chip, signals can be read out at high speed to make it possible to achieve a high-speed operation and high resolution.

In the CMOS solid-state imaging elements, for example, a correlated double sampling (CDS) technology disclosed in Japanese Unexamined Patent Application Publication No. 2010-129705 has been widely used.

Now, a general CDS technology will be described in detail.

The pixel circuit illustrated in FIG. 2 in Japanese Unexamined Patent Application Publication No. 2010-129705 is constituted by a photodetector (PD) portion for detecting an optical signal, a floating diffusion (FD) portion for converting charge generated by the PD portion into a voltage signal and temporarily holding the voltage signal, a TX transistor for transferring the charge signal from the PD portion to the FD portion, a RES transistor for resetting a voltage of the FD portion, an AMP transistor for amplifying the voltage signal of the FD portion, and a SEL transistor for outputting the amplified signal. In general, the PD portion is constituted by a photodiode. The TX transistor is controlled with a control signal φTX, the RES transistor is controlled with a control signal φRST, and the SEL transistor is controlled with a control signal φSEL.

In the drive of each pixel, as illustrated in FIG. 6 in Japanese Unexamined Patent Application Publication No. 2010-129705, φRST is first set to a high level to turn on the RES transistor, so that charge accumulated in the FD portion is reset. Next, φRST is set to a low level to turn off the RES transistor, and then φSEL is set to a high level to turn on the SEL transistor, so that a reset voltage is output. At this point in time, since the reset voltage includes reset noise called kTC noise, time-series fluctuations occur. Thereafter, φTX is set to a high level to turn on the TX transistor, so that the signal charge accumulated in the FD portion is transferred to the PD portion. Thereafter, φTX is set to a low level to turn off the TX transistor, and the signal voltage is output. Since the signal voltage becomes a signal that has changed from the reset voltage by a voltage corresponding to the accumulated signal charge, a circuit at a subsequent stage determines a difference between the reset voltage (in other words, reset charge) and the signal voltage (in other words, the reset charge+the signal charge) to make it possible to cancel the kTC noise and to make it possible to detect only a voltage corresponding to the accumulated signal charge.

The above-described technology has an advantage of significantly reducing reset noise (kTC noise) that occurs during reset of the pixel section, and the reset noise reduction due to the CDS technology is also one factor for why the CMOS solid-state imaging elements are becoming mainly used.

SUMMARY

In the field of imaging devices, there are demands for an imaging device that can reduce, in a state in which noise is reduced, a time lag from reception of the trigger signal for giving an instruction for starting exposure until the start of the exposure. One non-limiting and exemplary embodiment provides an imaging device and so on that can reduce, in a state in which noise is reduced, the time lag from reception of the trigger signal for giving an instruction for starting exposure until the start of the exposure.

In one general aspect, the techniques disclosed here feature an imaging device including: a plurality of pixels arrayed in a matrix, the plurality of pixels respectively including photoelectric converters that convert light into signal charge and charge accumulators that accumulate the signal charge; and a control circuit that causes pixels included in the plurality of pixels and belonging to at least one row to sequentially perform, for each row or for two or more rows at a time, a reset operation for initializing potentials of the charge accumulators, before receiving a trigger signal for giving an instruction for starting exposure, and causes, after receiving the trigger signal, the plurality of pixels to simultaneously perform an exposure operation for accumulating the signal charge in the charge accumulators without causing the pixels included in the plurality of pixels and belonging to at least one row to perform the reset operation.

The imaging device according to one aspect of the present disclosure can reduce, in a state in which noise is reduced, the time lag from reception of the trigger signal for giving an instruction for starting the exposure until the start of the exposure.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 5A is a timing chart illustrating one example of operations in the imaging device according to a comparative example;

FIG. 5B is a flowchart illustrating one example of the operations in the imaging device according to the comparative example;

FIG. 7 is a flowchart illustrating yet another example of the operations in the imaging device according to the first embodiment;

Figure 1A:
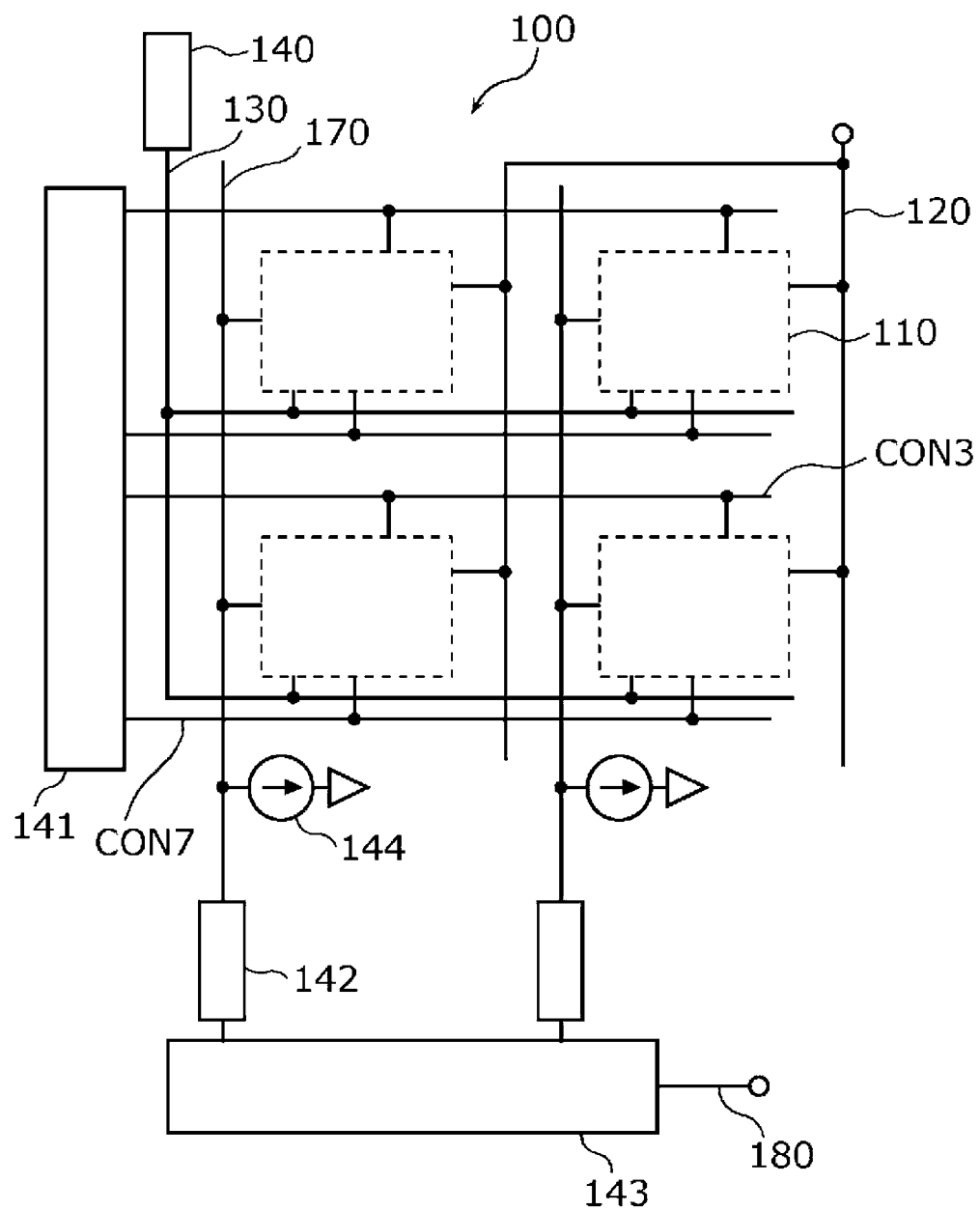
FIG. 1A is a diagram schematically illustrating an exemplary circuit configuration of an imaging device according to a first embodiment.

DETAILED DESCRIPTIONS (Underlying Knowledge that Led to the Present Disclosure)

The CDS technology described above is based on the premise that signal charge generated in PD portions for detecting optical signals is completely transferred during transfer to FD portions where the signal charge is converted into voltage signals. In order to realize the complete transfer, there are problems that the processes become complicated, and the manufacturing cost increases, and so on.

Also, for example, a solid-state imaging element having pixels with a structure for realizing a global shutter has been recently proposed as a solid-state imaging element for imaging a high-speed operating object without distortion, as disclosed in Japanese Unexamined Patent Application Publication No. 2008-28516.

In the solid-state imaging element disclosed in Japanese Unexamined Patent Application Publication No. 2008-28516, since charge in the PD portions in all pixels is transferred to the FD portions at a time, and then the charge is sequentially read out for each row, the CDS technology for reading out reset voltages before signal voltages in the FD portions are read out cannot be applied thereto. Accordingly, the FD portions are reset after the signal voltages in the FD portions are read out, and the reset voltages are read out, and differences between the signal voltages and the reset voltages are determined. However, since reset noise included in the signal voltages and reset noise included the reset voltages are not correlated with each other, there are problems that the reset noise cannot be removed, and random noise increases compared with readout using the above-described CDS technology.

In addition, since the area per pixel has recently decreased due to an increase in the number of pixels, for example, an organic CMOS sensor in which an organic photoelectric conversion film is used in PD portions has been proposed, like that disclosed in Japanese Unexamined Patent Application Publication No. 2014-78870, as a solid-state imaging element for overcoming a sensitivity decline due to a decrease in the areas of the PD portions. In this organic CMOS sensor, when organic photoelectric conversion films, which are light receiving portions, are provided above readout circuits, the areas of the light receiving portions can be increased even when the pixel size is reduced. Thus, it is possible to realize high sensitivity.

On the other hand, since sensors using photoelectric conversion films, like organic CMOS sensors, have a structure in which PD portions and semiconductor layers are electrically connected through metal wires, signal charge cannot be completely transferred. Accordingly, in general, a structure in which the signal charge in the PD portions is read out through electrical connection of the PD portions and the FD portions is employed so as to prevent occurrence of incomplete transfer noise and afterimage.

Thus, signal voltages in the FD portions are read out while voltages that are changed by charge accumulated during exposure are sensed at the FD portions, the reset voltages are then read out in a state in which the FD portions are reset, and differences between the signal voltages and the reset voltages are determined. However, since reset noise included in the signal voltages and reset noise included the reset voltages are not correlated with each other, there are problems that the reset noise cannot be removed, and random noise increases compared with readout using the above-described CDS technology.

Although the CDS technology is effective in reducing the reset noise, there are problems that it brings about a manufacturing cost increase involved with complication of the processes and cannot be further applied to CMOS solid-state imaging elements having a structure that has advantages in terms of functions and performance.

Also, for example, a technology for removing reset noise for each row without using the CDS technology has been proposed, like that disclosed in Japanese Unexamined Patent Application Publication No. 2001-177084.

However, with a method for removing reset noise for each row, particularly, in specifications of industrial cameras, cameras for business broadcast, and medical cameras, and so on, when an instruction signal for starting exposure, particularly, for simultaneously starting exposure of two or more pixels or for starting surface batch exposure is input with a trigger signal from outside, it takes a time for removing reset noise in the pixels for each row before the exposure. Consequently, a time delay of a few milliseconds to tens of milliseconds occurs from when the trigger signal is issued until the exposure is started, thus causing problems in that, for example, what the user wants to image cannot be imaged, and high-speed inspection cannot be performed. The trigger signal is, for example, a signal issued according to an operation of another machine or the like or a signal issued when a shutter button or the like is pressed by a person.

In the solid-state imaging element disclosed in Japanese Unexamined Patent Application Publication No. 2010-

258682, a configuration in which two trigger signals are provided in advance is employed to thereby make it possible to start exposure at high speed; however, signal control becomes complicated.

Accordingly, in view of the foregoing situation, an object of the present disclosure is to provide an imaging device including a solid-state imaging element that appropriately removes reset noise and that can start exposure at high speed in response to an external trigger signal.

An overview of one aspect of the present disclosure is as follows.

An imaging device according to one aspect of the present disclosure includes: a plurality of pixels arrayed in a matrix, the plurality of pixels respectively including photoelectric converters that convert light into signal charge and charge accumulators that accumulate the signal charge; and a control circuit that causes pixels included in the plurality of pixels and belonging to at least one row to sequentially perform, for each row or for two or more rows at a time, a reset operation for initializing potentials of the charge accumulators, before receiving a trigger signal for giving an instruction for starting exposure, and causes, after receiving the trigger signal, the plurality of pixels to simultaneously perform an exposure operation for accumulating the signal charge in the charge accumulators without causing the pixels included in the plurality of pixels and belonging to at least one row to perform the reset operation.

With this arrangement, after the trigger signal is received, the control circuit causes the pixels belonging to at least one row to execute the exposure operation without performing the reset operation. Thus, the time from the reception of the trigger signal to the exposure operation is reduced compared with a case in which the reset operation is executed on all the pixels after the trigger signal is received. Also, since the reset operation is performed on the pixels belonging to at least one row before the trigger signal is received, the potentials are initialized before the signal charge is accumulated, and in particular, when the reset operation is performed in conjunction with reduction of reset noise, noise in the signal charge in the pixels belonging to at least one row is reduced. Hence, the imaging device according to this aspect makes it possible to reduce the time lag from reception of the trigger signal for giving an instruction for starting the exposure until the start of the exposure, in a state in which noise is reduced.

Also, for example, before receiving the trigger signal, the control circuit may cause all the plurality of pixels to sequentially perform the reset operation for each row or for two or more rows at a time.

With this arrangement, since the reset operation is performed on the pixels belonging to all rows before the trigger signal is received, the potentials are initialized before the signal charge is accumulated, and in particular, when the reset operation is performed in conjunction with reduction of reset noise, noise in the signal charge in all the pixels is reduced.

Also, for example, before receiving the trigger signal, the control circuit may cause the pixels included in the plurality of pixels and belonging to at least one row to perform the reset operation a plurality of times.

With this arrangement, before the control circuit receives the trigger signal, the reset operation is performed on the pixels belonging to at least one row a plurality of times. Thus, in the pixels on which the reset operation is performed a plurality of times, after the reset operation is performed once, the charge accumulated in the charge accumulators owing to dark current or the like is initialized again by the reset operation. Hence, since noise that derives from the charge accumulated owing to dark current or the like is reduced, the imaging device according to this aspect can further reduce noise.

Also, for example, the control circuit may cause the plurality of pixels to repeatedly perform the reset operation sequentially for each row or for two or more rows at a time, until the trigger signal is received.

With this arrangement, the reset operation is repeatedly performed on the pixels until the control circuit receives the trigger signal. Thus, the charge accumulated in the charge accumulators owing to dark current or the like after the reset operation is performed is repeatedly initialized by the reset operation. Hence, since noise that derives from the charge accumulated owing to dark current or the like is reduced, the imaging device according to this aspect can further reduce noise.

Also, for example, after the exposure operation, the control circuit may cause the plurality of pixels to sequentially perform a readout operation for outputting signals corresponding to the signal charge accumulated in the charge accumulators, the readout operation being performed for each row or for two or more rows at a time from a row at which the reset operation was started.

With this arrangement, since the row at which the reset operation is started and the row at which the readout operation is started become the same, it is possible to suppress the control circuit becoming complicated. Also, since data to be read out is temporally continuously read out from an upper row to a lower row or from a lower row to an upper row, continuity of images to be acquired is maintained.

Also, for example, the control circuit may cause the plurality of pixels to sequentially perform, for each row or for two or more rows at a time, the reset operation up to a row different from a row at which the reset operation was started, and may cause, after the exposure operation, the plurality of pixels to sequentially perform a readout operation for outputting signals corresponding to the signal charge accumulated in the charge accumulators, the readout operation being performed for each row or for two or more rows at a time from a next row of a row at which the reset operation was ended.

When this arrangement, the times from the reset operation to the readout operation on the respective rows become generally the same. Thus, after the reset operation is performed, differences between the amounts of charge accumulated in the charge accumulators in the individual rows decrease, the charge accumulation being caused by dark current or the like. Hence, differences in noise between the pixels are reduced.

Also, for example, each of the plurality of pixels may include a feedback circuit for negatively feeding back a potential of the charge accumulation portion in the reset operation.

With this arrangement, reset noise that occurs during the reset operation is reduced. Hence, the imaging device according to this aspect can further reduce noise.

Also, for example, each of the plurality of pixels may include a circuit for reducing reset noise that occurs in the reset operation.

With this arrangement, reset noise that occurs during the reset operation is reduced. Hence, the imaging device according to this aspect can further reduce noise.

Also, for example, the imaging device may further include a voltage supply circuit. The photoelectric converting portion may include a counter electrode electrically connected to the voltage supply circuit, pixel electrodes electrically connected to the charge accumulators, and a photoelectric conversion layer located between the counter electrode and the pixel electrodes. The control circuit may cause the voltage supply circuit to apply a voltage to the counter electrode to form an electric field in the photoelectric conversion layer to cause the plurality of pixels to perform the exposure operation.

With this arrangement, in a stacked imaging device for which the reset operation for each row or for two or more rows at a time is effective, the time lag from the reception of the trigger signal for giving an instruction for starting the exposure until the start of the exposure can be reduced in a state in which noise is reduced. Also, since the exposure operation is performed upon voltage application to the counter electrode, it is possible to suppress the circuit becoming complicated.

Also, a control method according to one aspect of the present disclosure is a control method for an imaging device including a plurality of pixels arrayed in a matrix, the plurality of pixels respectively including photoelectric converters that convert light into signal charge and charge accumulators that accumulate the signal charge. The control method includes: sequentially performing, before receiving a trigger signal for giving an instruction for starting exposure, a reset operation for initializing potentials of the charge accumulators on pixels included in the plurality of pixels and belonging to at least one row, the reset operation being performed for each row or for two or more rows at a time, and simultaneously performing, after the trigger signal is received, an exposure operation for accumulating the signal charge in the charge accumulators on the plurality of pixels without performing the reset operation on the pixels included in the plurality of pixels and belonging to at least one row.

With this arrangement, after the trigger signal is received, the pixels belonging to at least one row are caused to execute the exposure operation without performing the reset operation. Thus, the time from the reception of the trigger signal to the exposure operation is reduced compared with a case in which the reset operation is executed on all the pixels after the trigger signal is received. Also, with this arrangement, since the reset operation is performed on the pixels belonging to all rows before the trigger signal is received, the potentials are initialized before the signal charge is accumulated, and in particular, when the reset operation is performed in conjunction with reduction of reset noise, noise in the signal charge is reduced. Hence, the control method according to this aspect can reduce, in a state in which noise is reduced, the time lag from the reception of the trigger signal for giving an instruction for starting the exposure until the start of the exposure.

Embodiments of an imaging device and so on according to the present disclosure will be described with reference to the accompanying drawings. Although the present disclosure is described below using embodiments below and the accompanying drawings, this is for illustrative purposes, and the present disclosure is not intended to be limited to these embodiments.

The embodiments described below each present a general or specific example. Numerical values, shapes, materials, constituent elements, the arrangement positions and connection forms of constituent elements, steps, the order of steps, and so on described in the embodiments below are merely examples and are not intended to limit the present disclosure.

Also, elements that are essential for operations of an imaging device or are effective in improving characteristics but that are not needed to describe the present disclosure are omitted herein. Also, each drawing is a figure merely illustrating a concept, and scales, shape, and so on have not been considered at all. Accordingly, for example, scales and so on do not necessarily match in each drawing. Also, in the individual drawings, substantially the same constituent elements are denoted by the same reference numerals, and redundant descriptions are omitted or are briefly given.

Also, herein, the terms "equal" and so on representing relationships between elements, terms "square shape", "circular shape", and so on representing element shapes, and the ranges of numerical values are not expressions representing only exact meanings and are expressions representing substantially equivalent ranges, for example, expressions meaning that they include differences of about several percent.

Also, herein, the terms "above" and "below" do not refer to an upper direction (a vertically upper side) and a lower direction (a vertically lower side) in absolute spatial recognition and are used as terms defined by relative positional relationships based on the order of stacked layers in a stack configuration. Also, the terms "above" and "below" apply not only to cases in which two constituent elements are arranged with a gap therebetween and a constituent element exists between the two constituent elements and but also to cases in which two constituent elements are arranged to adhere to each other and the two constituent elements contact each other.

First Embodiment

First, a structure of an imaging device 100 according to a first embodiment will be described with reference to FIGS. 1A to 3.

[Structure of Imaging Device]

FIG. 1A is a diagram schematically illustrating an exemplary circuit configuration of the imaging device 100 according to the present embodiment. The imaging device 100 is a stacked imaging element in one example and has a photoelectric conversion layer stacked on a semiconductor substrate. The imaging device 100 includes a plurality of pixels 110 and peripheral circuitry. The peripheral circuitry includes a control circuit for controlling operations of the plurality of pixels 110. Upon receiving an external trigger signal, the control circuit causes the plurality of pixels 110 to perform an exposure operation.

The pixels 110 are arrayed two-dimensionally to form a photosensitive region, which is a so-called pixel region. The pixels 110 may be arrayed one dimensionally. In this case, the imaging device 100 is a line sensor.

In the illustrated example, the pixels 110 are arrayed in row directions and column directions. Herein, the row directions and the column directions refer to directions in which rows and columns extend, respectively. That is, vertical directions are the column directions, and horizontal directions are the row directions.

Each of the pixels 110 is connected to a power-supply line 120. A predetermined power-supply voltage is supplied to each pixel 110 through the power-supply line 120. Also, as illustrated in FIG. 1A, the imaging device 100 has an accumulation control line 130 through which the same constant voltage to all photoelectric conversion layers that photoelectrically convert incident light. However, when other control, such as fluctuation reduction, is performed, the constant voltage may be divided into some voltages for application.

The peripheral circuitry includes a voltage supply circuit 140, a vertical scanning circuit 141, column signal processing circuits 142, a horizontal signal readout circuit 143, and constant-current sources 144. The vertical scanning circuit 141 is also referred to as a "row scanning circuit", and the horizontal signal readout circuit 143 is also referred to as a "column scanning circuit". The column signal processing circuits 142 and the constant-current sources 144 may be arranged for corresponding columns of the pixels 110 arrayed two-dimensionally.

One example of a configuration of the peripheral circuitry will be described below.

The voltage supply circuit 140 is connected to the accumulation control line 130. During operation of the imaging device 100, the voltage supply circuit 140 applies a predetermined bias voltage to a counter electrode 1b (details of which are described later) of the pixels 110 through the accumulation control line 130. A control circuit controls operations of the voltage supply circuit 140.

The vertical scanning circuit 141 is connected to selection-control signal lines CON7 and amplification-control signal lines CON3. The amplification-control signal lines CON3 are referred to as "band-control signal lines", and the selection-control signal lines CON7 are referred to as "address signal lines". The vertical scanning circuit 141 is a portion of the control circuit that controls operations of the pixels 110. The vertical scanning circuit 141 selects the pixels 110, arranged in the rows, for each row by applying a predetermined voltage to the selection-control signal lines CON7. Thus, signal voltages of the selected the pixel cells 110 are read out, and pixel electrodes described below are reset.

The pixels 110 arranged in the individual columns are electrically connected to the column signal processing circuits 142 through signal-readout signal lines 170 corresponding to the respective columns. The signal-readout signal lines 170 are also referred to as "vertical signal lines". The column signal processing circuits 142 perform noise-reduction signal processing, typified by correlated double sampling, analog-to-digital conversion (AD conversion), and so on. The horizontal signal readout circuit 143 is electrically connected to the column signal processing circuits 142 provided corresponding to the columns of the pixels 110. The horizontal signal readout circuit 143 sequentially reads out signals from the column signal processing circuits 142 to a horizontal common signal line 180.

One example of a circuit configuration of the pixels 110 will be described next.

Figure 1B:
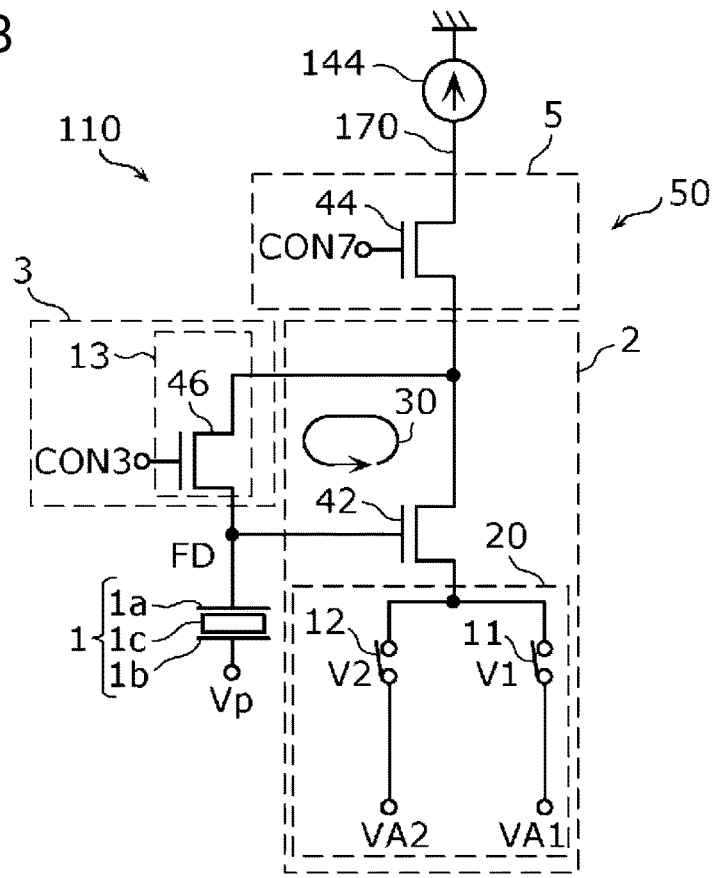
FIG. 1B is a diagram schematically illustrating an exemplary circuit configuration of one pixel in the imaging device according to the first embodiment.

FIG. 1B is a diagram schematically illustrating an exemplary circuit configuration of one pixel 110 in the imaging device 100 according to the present embodiment. The pixel 110 includes a photoelectric converting portion 1, an amplifier 2, a band control portion 3, a charge accumulation portion FD, and an output selecting portion 5. The photoelectric converting portion 1 detects light and converts the light into signal charge. The charge accumulation portion FD accumulates the signal charge generated by the photoelectric converting portion 1. The amplifier 2, the band control portion 3, the charge accumulation portion FD, and the output selecting portion 5 form a readout circuit 50.

The photoelectric converting portion 1 converts light into signal charge. The readout circuit 50 reads out the signal charge generated by the photoelectric converting portion 1. The photoelectric converting portion 1 includes, for example, a pixel electrode 1a, the counter electrode 1b, and a photoelectric conversion layer 1c sandwiched between the pixel electrode 1a and the counter electrode 1b. The pixel electrode 1a is electrically connected to the charge accumulation portion FD. The counter electrode 1b is connected to the accumulation control line 130 illustrated in FIG. 1A and is electrically connected to the voltage supply circuit 140 through the accumulation control line 130. For example, when a reference voltage Vp is applied to the counter electrode 1b, and one end of a node that forms the charge accumulation portion FD is connected to the pixel electrode 1a, signal charge generated by the photoelectric conversion layer 1c in the photoelectric converting portion 1 can be accumulated in the charge accumulation portion FD.

The charge accumulation portion FD is connected to the photoelectric converting portion 1 through a wiring layer. The charge accumulation portion FD accumulates the signal charge generated by the photoelectric converting portion 1. The charge accumulation portion FD is further connected to an input of the amplifier 2. The amplifier 2 amplifies a signal corresponding to the signal charge accumulated in the charge accumulation portion FD and outputs the amplified signal to the band control portion 3 and the output selecting portion 5.

The amplifier 2 and the band control portion 3 form a feedback circuit 30 via the charge accumulation portion FD. The band control portion 3 includes a band control circuit 13. At least three voltages that are different from each other are supplied from a voltage control circuit to the band control circuit 13. Since such voltages are supplied, the band control circuit 13 has a band control function. The voltage control circuit is, for example, a portion of the vertical scanning circuit 141. The band control circuit 13 applies a band limitation to an output signal of the amplifier 2 to output a resulting signal to the charge accumulation portion FD. In the feedback circuit 30, a signal read out from the charge accumulation portion FD is amplified by the amplifier 2, is subjected to the band limitation by the band control circuit 13, and is fed back to the charge accumulation portion FD.

The feedback circuit 30 negatively feeds back a signal of the photoelectric converting portion 1 to the charge accumulation portion FD via an amplifying transistor 42. In other words, the feedback circuit 30 is a circuit that negatively feeds back a potential of the charge accumulation portion FD during a reset operation, which is described below.

The amplifier 2 has the amplifying transistor 42 and a switching circuit 20, which includes a first switching element 11 and a second switching element 12. Transistors in the readout circuit 50 are, for example, N-channel metal-oxide-semiconductor field-effect transistors (MOSFETs). Electrical connection relationships in the readout circuit 50 will be described below. The amplifier 2 in the pixel 110 does not necessarily have to have the switching circuit 20, and the switching circuit 20 may be included in the peripheral circuitry.

The charge accumulation portion FD is connected to a gate of the amplifying transistor 42. The band control portion 3 includes a band control transistor 46. The output selecting portion 5 includes a selecting transistor 44. One of a source and a drain of the amplifying transistor 42 is connected to one of a source and a drain of the band control transistor 46 and is connected to one of a source and a drain of the selecting transistor 44. Also, the other of the source and the drain of the band control transistor 46 is connected to the charge accumulation portion FD. The band control transistor 46 and a capacitance component that is parasitic in the charge accumulation portion FD form a resistor-capacitor (RC) filter circuit.

The amplification-control signal line CON3 is connected to a gate of the band control transistor 46. The state of the band control transistor 46 is determined by a voltage of the amplification-control signal line CON3. For example, when the voltage of the amplification-control signal line CON3 is at a high level, the band control transistor 46 is turned on. As a result, the charge accumulation portion FD, the amplifying transistor 42, and the band control transistor 46 form a feedback path.

When the voltage of the amplification-control signal line CON3 decreases, a resistance component of the band control transistor 46 increases. Thus, the bandwidth of the band control transistor 46 decreases, and the frequency range of the signal that is fed back becomes narrow. When the voltage of the amplification-control signal line CON3 reaches a low level, which is lower than the previous level, the band control transistor 46 is turned off. As a result, no feedback path is formed.

The other of the source and the drain of the selecting transistor 44 is connected to the signal-readout signal line 170. A gate of the selecting transistor 44 is controlled through the selection-control signal line CON7. The state of the selecting transistor 44 is determined by a voltage of the selection-control signal line CON7. For example, when the voltage of the selection-control signal line CON7 is at a high level, the selecting transistor 44 is turned on. As a result, the amplifying transistor 42 and the signal-readout signal line 170 are electrically connected to each other. When the voltage of the selection-control signal line CON7 is at a low level, the selecting transistor 44 is turned off. As a result, the amplifying transistor 42 and the signal-readout signal line 170 are electrically isolated from each other.

The switching circuit 20 is connected to the other of the source and the drain of the amplifying transistor 42. Specifically, the other of the source and the drain of the amplifying transistor 42 is connected to a first voltage supply VA1 via the first switching element 11. Also, the other of the source and the drain of the amplifying transistor 42 is also connected to a second voltage supply VA2 via the second switching element 12. The switching circuit 20 is controlled with control signals V1 and V2 to thereby switch a voltage, applied to the other of the source and the drain of the amplifying transistor 42, to a voltage Va1 or a voltage Va2. The voltage Va1 of the first voltage supply VA1 is, for example, a ground voltage GND. The voltage Va2 of the second voltage supply VA2 is, for example, a power-supply voltage VDD. The switching circuit 20 may be provided for each pixel or may be shared by two or more pixels in order to reduce the number of elements per pixel.

The output selecting portion 5 is connected to the signal-readout signal line 170. The signal-readout signal line 170 is shared by at least two pixels. The signal amplified by the amplifier 2 is output to the signal-readout signal line 170 via the output selecting portion 5.

The constant-current source 144 is connected to the signal-readout signal line 170. When the selecting transistor 44 is on, the selecting transistor 44, the amplifying transistor 42, and the constant-current source 144 form a source follower circuit. The signal corresponding to the signal charge accumulated in the charge accumulation portion FD is output to the signal-readout signal line 170 and is read out to outside. The constant-current source 144 may be provided for each pixel or may be shared by two or more pixels in order to reduce the number of elements per pixel.

Figure 1C:
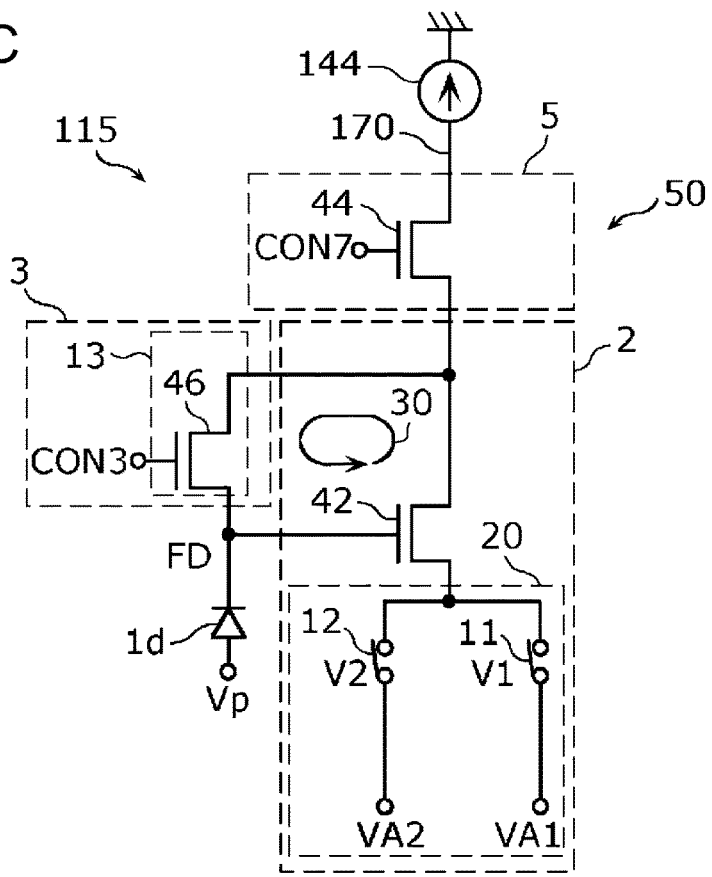
FIG. 1C is a diagram schematically illustrating another exemplary circuit configuration of one pixel in the imaging device according to the first embodiment.

The photoelectric converting portion 1 is not limited to such a configuration and may be an element, such as a photodiode, having another photoelectric conversion function. FIG. 1C is a diagram schematically illustrating an exemplary circuit configuration of one pixel 115 in the imaging device 100 according to the present embodiment. Compared with the above-described pixel 110, the pixel 115 illustrated in FIG. 1C differs in that the photoelectric converting portion 1 is replaced with a photoelectric converting portion 1d. The configuration other than the photoelectric converting portion 1d in the pixel 115 is substantially the same as that of the pixel 110. As illustrated in FIG. 1C, the pixel 115 includes the photoelectric converting portion 1d implemented by a photodiode. For example, when the reference voltage Vp is applied to one end of the photoelectric converting portion 1d, and one end of the node that forms the charge accumulation portion FD is connected to the other end of the photoelectric converting portion 1d, signal charge generated by the photoelectric converting portion 1d can be accumulated in the charge accumulation portion FD.

Next, a description will be given of a pixel structure of the imaging device 100 according to the present embodiment.

Figure 2:
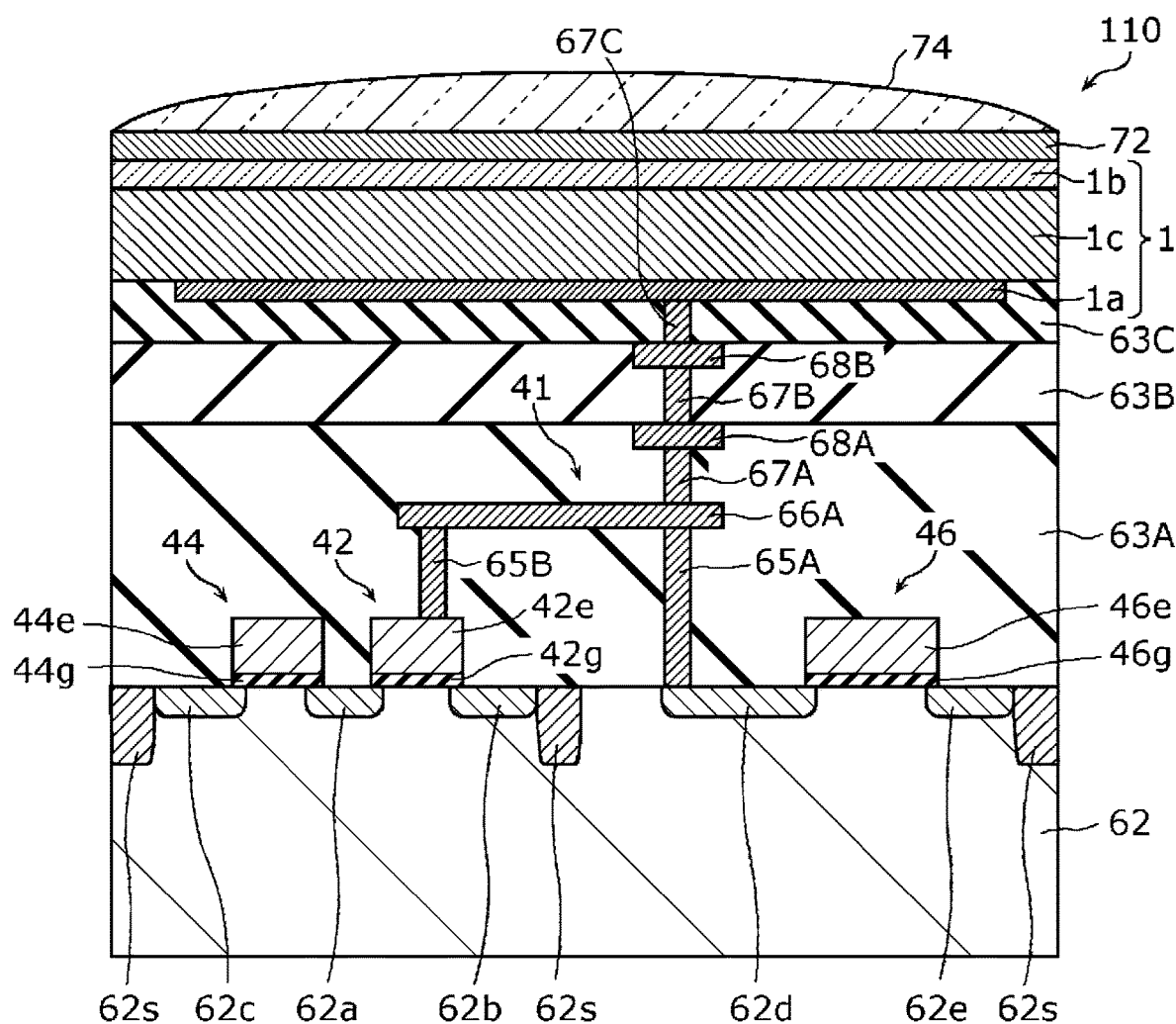
FIG. 2 is a sectional view schematically illustrating a device structure of one pixel in the imaging device according to the first embodiment.

FIG. 2 is a sectional view schematically illustrating a device structure of the pixels 110 in the imaging device 100 according to the present embodiment. In the configuration illustrated in FIG. 2, the pixels 110 include a semiconductor substrate 62 that supports the photoelectric converters 1. The semiconductor substrate 62 is, for example, a silicon substrate. As illustrated in FIG. 2, each photoelectric converting portion 1 is arranged above the semiconductor substrate 62. In this example, interlayer insulating layers 63A, 63B, and 63C are stacked on the semiconductor substrate 62, and a stack of the pixel electrode 1a, the photoelectric conversion layer 1c, and the counter electrodes 1b is disposed on the interlayer insulating layer 63C. The pixel electrodes 1a are sectioned for the respective pixels, and the pixel electrodes 1a in two adjacent pixels 110 are formed spatially separated from each other, so that two adjacent pixel electrodes 1a are electrically isolated from each other. Also, the photoelectric conversion layer 1c and the counter electrode 1b may be formed so as to extend through two or more pixels 110. The signal charge generated by the photoelectric converting portion 1 is accumulated in a charge accumulation node 41 between the gate of the amplifying transistor 42 and the photoelectric converting portion 1. The charge accumulation node 41 is one example of the above-described charge accumulation portion FD.

For example, as illustrated in FIG. 2, each photoelectric converting portion 1 includes the pixel electrode 1a, the counter electrode 1b that faces the pixel electrode 1a, and the photoelectric conversion layer 1c located between the pixel electrode 1a and the counter electrode 1b.

The pixel electrode 1a is an electrode for reading out the signal charge generated by the photoelectric converting portion 1. At least one pixel electrode 1a is provided in each pixel 110. The pixel electrode 1a is electrically connected to a gate electrode 42e of the amplifying transistor 42 and an impurity region 62d.

The pixel electrode 1a is formed using an electrically conductive material. The electrically conductive material is, for example, metal such as aluminum or copper, metal nitride, or polysilicon given electrical conductivity by impurity doping.

The counter electrode 1b is, for example, a transparent electrode formed of a transparent electrically conductive material. The counter electrode 1b is arranged at a light incidence side of the photoelectric converting portion 1.

Accordingly, light that is transmitted through the counter electrode 1b is incident on the photoelectric conversion layer 1c.

The term "transparent" as used herein means transmitting at least part of light in a wavelength range to be detected and does not necessarily have to transmit light in the entire visible-light wavelength range.

The counter electrode 1b is formed, for example, using a transparent conducting oxide (TCO), such as indium tin oxide (ITO).

The photoelectric conversion layer 1c generates hole-electron pairs, upon receiving incident light. For example, a semiconductive inorganic material, a semiconductive organic material, or the like is used as the material of the photoelectric conversion layer 1c. The photoelectric conversion layer 1c is, for example, an organic photoelectric conversion film.

The amplifying transistors 42, the selecting transistors 44, and the band control transistors 46 are formed at the semiconductor substrate 62.

Each amplifying transistor 42 includes impurity regions 62a and 62b formed in the semiconductor substrate 62, a gate insulating layer 42g located on the semiconductor substrate 62, and the gate electrode 42e located on the gate insulating layer 42g. One of the impurity regions 62a and 62b functions as the drain of the amplifying transistor 42, and the other thereof functions as the source of the amplifying transistor 42. The impurity region 62a and 62b and impurity regions 62c, 62d, and 62e described below are, for example, n-type impurity regions.

Each selecting transistor 44 includes the impurity regions 62a and 62c formed in the semiconductor substrate 62, a gate insulating layer 44g located on the semiconductor substrate 62, and a gate electrode 44e located on the gate insulating layer 44g. One of the impurity regions 62a and 62c functions as the drain of the selecting transistor 44, and the other thereof functions as the source of the selecting transistor 44. In this example, the amplifying transistor 42 and the selecting transistor 44 share the impurity region 62a, so that the source (or the drain) of the amplifying transistor 42 and the drain (or the source) of the selecting transistor 44 are electrically connected to each other.

Each band control transistor 46 includes the impurity regions 62d and 62e formed in the semiconductor substrate 62, a gate insulating layer 46g located on the semiconductor substrate 62, and a gate electrode 46e located on the gate insulating layer 46g. One of the impurity regions 62d and 62e functions as the drain of the band control transistor 46, and the other thereof functions as the source of the band control transistor 46.

In the semiconductor substrate 62, an element isolation region 62s is provided between the pixels 110 that are adjacent to each other and between the amplifying transistor 42 and the band control transistor 46. The element isolation region 62s electrically isolates the pixels 110 that are adjacent to each other. Also, the provision of the element isolation region 62s between the pixels 110 that are adjacent to each other reduces leakage of the signal charge accumulated in the charge accumulation nodes 41.

A contact plug 65A connected to the impurity region 62d of the band control transistor 46, a contact plug 65B connected to the gate electrode 42e of the amplifying transistor 42, and a wire 66A that provides connection between the contact plugs 65A and 65B are formed in the interlayer insulating layer 63A. Thus, the impurity region 62d (e.g., the drain) of the band control transistor 46 and the gate electrode 42e of the amplifying transistor 42 are electrically connected to each other. In the configuration illustrated in FIG. 2, a plug 67A and a wire 68A are further formed in the interlayer insulating layer 63A. Also, a plug 67B and a wire 68B are formed in the interlayer insulating layer 63B, and a plug 67C is formed in the interlayer insulating layer 63C, so that the wire 66A and the pixel electrode 1a are electrically connected to each other. The contact plugs 65A and 65B, the wire 66A, the plug 67A, the wire 68A, the plug 67B, the wire 68B, and the plug 67C are typically composed of metal.

In the configuration illustrated in FIG. 2, a color filter 72 is arranged on the counter electrode 1b. Also, a microlens 74 is arranged on the color filter 72. Although not illustrated, a protective layer for protecting the photoelectric converting portion 1 may be disposed between the color filter 72 and the microlens 74. The material of the protective layer is, for example, silicon oxynitride (SiON) or aluminum oxide (AlO).

The imaging device 100 described above can be manufactured using a typical semiconductor manufacturing process. In particular, when a silicon substrate is used as the semiconductor substrate 62, the imaging device 100 can be manufactured utilizing various types of silicon semiconductor process.

Now, a photoelectric conversion operation will be described. Light input externally is collected by the microlens 74 in each pixel 110, only desired wavelengths are transmitted by the color filter 72, and the resulting light is incident on the photoelectric converting portion 1. The photoelectric converting portion 1 converts the light into charge. In a state in which a voltage is applied between the counter electrode 1b and the pixel electrode 1a to form an electric field thereacross, the charge resulting from the conversion is collected by the pixel electrode 1a and is accumulated in the charge accumulation node 41, in other words, in the charge accumulation portion FD.

Figure 3:
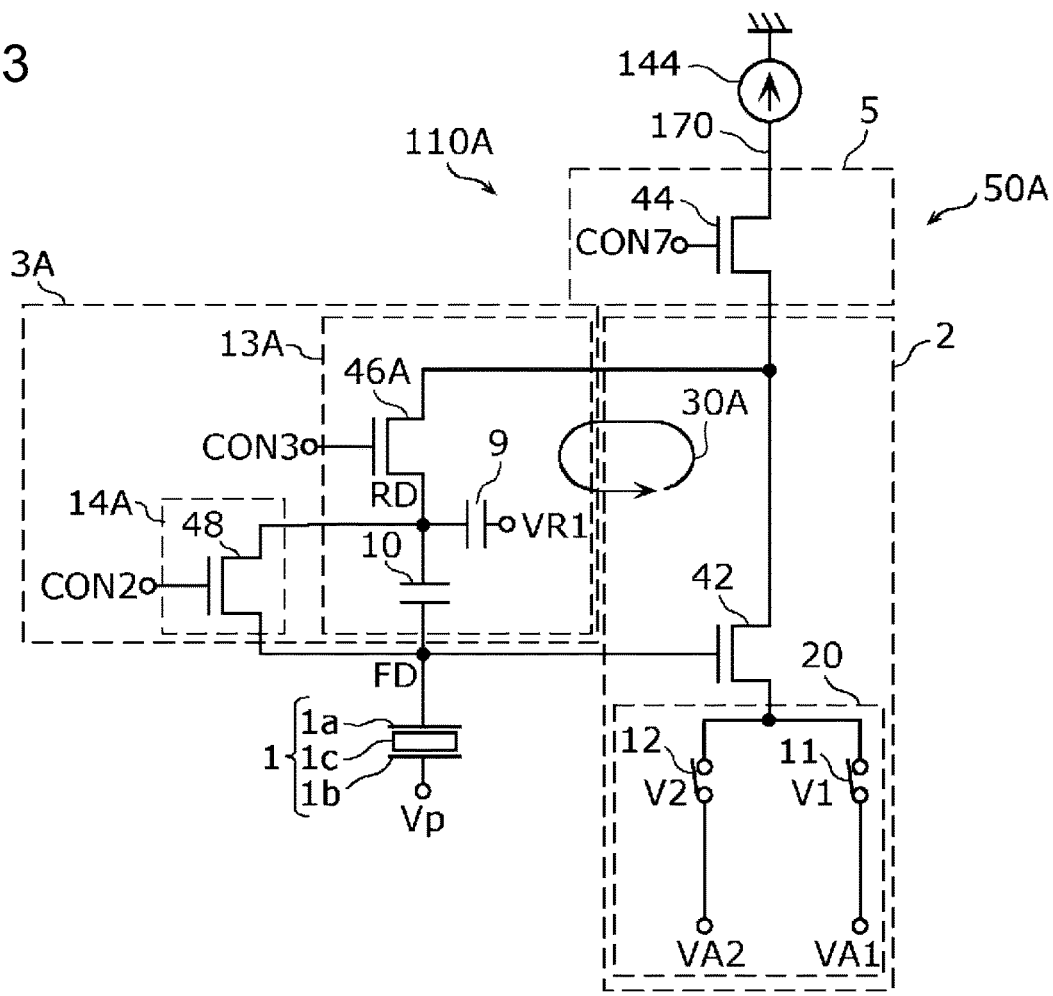
FIG. 3 is a diagram schematically illustrating another exemplary circuit configuration of one pixel in the imaging device according to the first embodiment.

Next, a description will be given of another example of the pixels according to the present embodiment. FIG. 3 is a diagram schematically illustrating an exemplary circuit configuration of one pixel 110A in the imaging device according to the present embodiment. Compared with the above-described pixel 110, the pixel 110A illustrated in FIG. 3 differs in that the band control portion 3 is replaced with a band control portion 3A. Points that differ from the pixel 110 will be mainly described below, and descriptions of common points will be omitted or briefly given.

In the pixel 110A, the amplifier 2, the band control portion 3A, the charge accumulation portion FD, and the output selecting portion 5 form a readout circuit 50A.

A feedback circuit 30A negatively feeds back a signal from the photoelectric converting portion 1 to the charge accumulation portion FD via the amplifying transistor 42. In other words, the feedback circuit 30A is a circuit for negatively feeding back the potential of the charge accumulation portion FD during a reset operation, which is described below.

The band control portion 3A includes a band control circuit 13A and a reset circuit 14A.

The band control circuit 13A is a circuit for reducing reset noise that occurs during a reset operation, which is described below. The band control circuit 13A includes a band control transistor 46A, a first capacitive element 9, and a second capacitive element 10. The "capacitive elements" as used herein each refer to a structure in which a dielectric, such as an insulating film, is interposed between electrodes. Also, the "electrodes" are not limited to electrodes formed of metal and are broadly construed as including a polysilicon layer and so on. The electrodes may be part of a semiconductor substrate. The first capacitive element 9 and the second capacitive element 10 may be, for example, metal-insulator-metal (MIM) capacitors or metal-insulator-semiconductor (MIS) capacitors. The reset circuit 14A includes a reset transistor 48.

Electrical connection relationships in the readout circuit 50A will be described below.

The gate of the amplifying transistor 42 is connected to the charge accumulation portion FD. One of the source and the drain of the amplifying transistor 42 is connected to one of a source and a drain of the band control transistor 46A. One of the source and the drain of the amplifying transistor 42 is also connected to one of the source and the drain of the selecting transistor 44. Also, the other of the source and the drain of the band control transistor 46A is connected to one end of the first capacitive element 9. Also, a reference voltage VR1 is applied to the other end of the first capacitive element 9. Thus, the band control transistor 46A and the first capacitive element 9 form an RC filter circuit.

The other of the source and the drain of the band control transistor 46A is also connected to one end of the second capacitive element 10. Also, the other end of the second capacitive element 10 is connected to the charge accumulation portion FD. A node formed among the band control transistor 46A, the first capacitive element 9, and the second capacitive element 10 is herein referred to as an "RD".

A gate of the band control transistor 46A is connected to the amplification-control signal line CON3. The state of the band control transistor 46A is determined by the voltage of the amplification-control signal line CON3. For example, when the voltage of the amplification-control signal line CON3 is at the high level, the band control transistor 46A is turned on. At this point in time, the charge accumulation portion FD, the amplifying transistor 42, the band control transistor 46A, and the second capacitive element 10 form the feedback circuit 30A.

When the voltage of the amplification-control signal line CON3 decreases, a resistance component of the band control transistor 46A increases. Thus, the bandwidth of the band control transistor 46A decreases, and the frequency region of a signal that is fed back becomes narrow.

When the feedback path is formed, a signal output by the band control transistor 46A is attenuated by an attenuation circuit formed by parasitic capacitances of the second capacitive element 10 and the charge accumulation portion FD, and the resulting signal is fed back to the charge accumulation portion FD. When the capacitance of the second capacitive element 10 is represented by Cc, and the parasitic capacitance of the charge accumulation portion FD is represented by Cfd, an attenuation rate is given by Cc/(Cc+Cfd).

When the voltage of the amplification-control signal line CON3 decreases further to reach the low level, the band control transistor 46A is turned off, and no feedback path is formed.

The charge accumulation portion FD is further connected to one of a source and a drain of the reset transistor 48. The other of the source and the drain of the reset transistor 48 is connected to the RD. Thus, a voltage of one of the source and the drain of the amplifying transistor 42 (i.e., an output voltage of the amplifier 2) is applied to the reset transistor 48. A gate of the reset transistor 48 is connected to a reset-control signal line CON2, and the state of the reset transistor 48 is determined by a voltage of the reset-control signal line CON2. The reset transistor 48 negatively feeds back a signal of the photoelectric converting portion 1 to the charge accumulation portion FD via the amplifying transistor 42. According to such a configuration, it is possible to reduce changes in the voltage of the charge accumulation portion FD before and after the reset transistor 48 is turned off, thus making it possible to perform higher-speed noise reduction.

[Operation of Pixels]

Next, a description will be given of operations of the pixels 110 in the imaging device 100. The control circuit in the imaging device 100 causes the pixels 110 to perform an exposure operation for accumulating signal charge in the charge accumulators FD, a reset operation for initializing the potentials of the charge accumulators FD, and a readout operation for outputting signals corresponding to the signal charge accumulated in the charge accumulators FD. Even when the pixels 110A or 115 are used instead of the pixels 110, basic operations are the same.

First, a description will be given of the exposure operation for accumulating signal charge in the charge accumulators FD. The control circuit causes the plurality of pixels 110 to perform the exposure operation in accordance with operations below.

Figure 4:
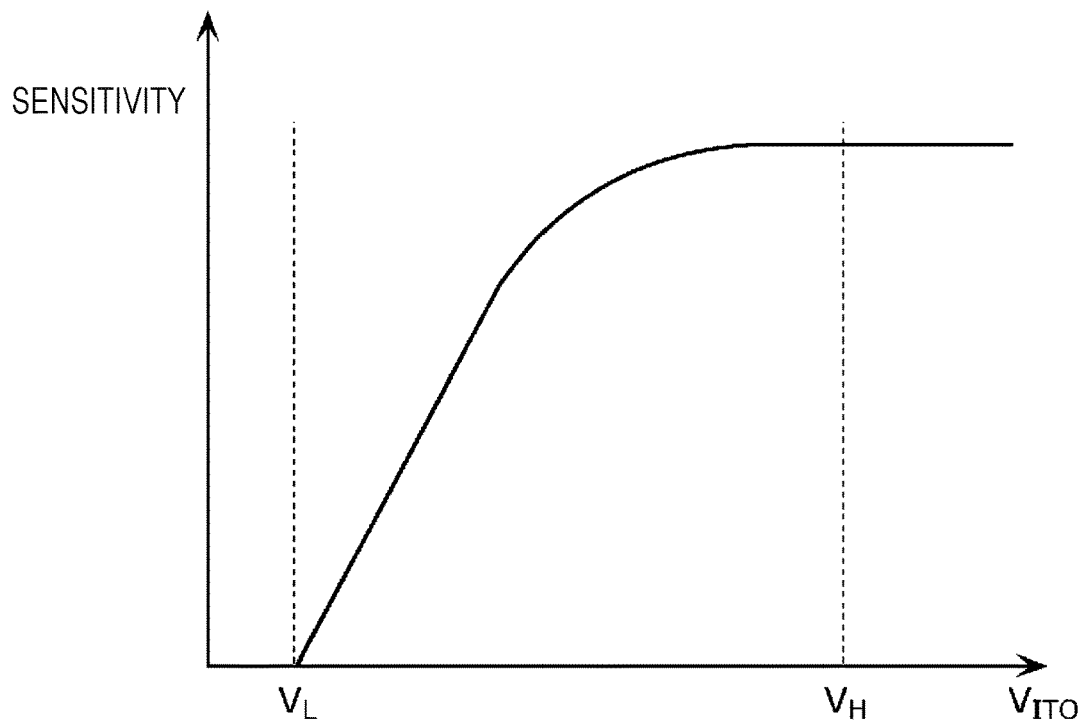
FIG. 4 is a graph illustrating one example of a photoelectric conversion characteristic of an organic photoelectric conversion film.

FIG. 4 is a graph illustrating one example of a photoelectric conversion characteristic of an organic photoelectric conversion film as one example of characteristics of the photoelectric conversion layer 1c. As illustrated in FIG. 4, the photoelectric conversion characteristic of the organic photoelectric conversion film is that the higher a voltage VITO of the counter electrode 1b is, the higher the sensitivity of the organic photoelectric conversion film is. For example, in a state in which the pixel electrodes 1a provided in the respective pixels 110 are set to a reset voltage VRST, when a high voltage is supplied to the counter electrode 1b, which is common to all the pixels 110, a high voltage VH is applied across the counter electrode 1b and the pixel electrodes 1a, so that the sensitivity of the organic photoelectric conversion film increases, and the photoelectric conversion is performed. The signal charge generated in the photoelectric conversion layer 1c is collected by the pixel electrodes 1a. When a low voltage is applied to the counter electrode 1b, the voltage across the counter electrode 1b and the pixel electrodes 1a is changed to a low voltage VL, so that the sensitivity of the organic photoelectric conversion film decreases, and the photoelectric conversion is stopped. That is, in a state in which the pixel electrodes 1a provided in the respective pixels 110 are set to the reset voltage VRST, when the high voltage is supplied to the counter electrode 1b, which is common to all the pixels 110, the exposure operation is started, and when the low voltage is supplied to the counter electrode 1b, the exposure operation is stopped. Also, at this point in time, the voltage of the amplification-control signal line CON3 illustrated in FIG. 1B is at the low level, and the band control transistor 46 is off. Also, in the case of the pixel 110A, the voltages of the reset-control signal line CON2 and the amplification-control signal line CON3 illustrated in FIG. 3 are at the low level, and the band control transistor 46A and the reset transistor 48 are off. As a result, during the exposure operation, signal charge is accumulated in the charge accumulation portion FD. Thus, in the imaging device 100 using the photoelectric conversion layer 1c, controlling the voltage applied to the counter electrode 1b makes it possible to control the photoelectric conversion characteristic, that is, the sensitivity. In the imaging device 100 according to the present embodiment, use of such control on a photoelectric conversion characteristic (i.e., the sensitivity characteristic) makes it possible to perform a global shutter operation for simultaneously performing an exposure operation on at least two or more pixels 110.

In this case, for an imaging device using a photoelectric conversion layer, a CDS scheme cannot be used because of the configuration in which the charge cannot be completely transferred, as described above. Accordingly, it is essential that reset noise (e.g., kTC noise) be reduced for each pixel before the exposure. Before the above-described global shutter exposure is performed, a reset operation is also needed for pixels to be exposed.

Next, the reset operation for initializing the potential of the charge accumulation portion FD will be described with reference to FIGS. 1B and 2. The control circuit causes the plurality of pixels 110 to perform the reset operation in accordance with operations below. The reset operation is performed for each row of the pixels 110. In the reset operation, for example, the reset noise is reduced, and also the potentials of the charge accumulators FD are initialized.

In the reset operation, the voltage of the selection-control signal line CONT is at the low level. Accordingly, the selecting transistor 44 is in an off state, and the amplifying transistor 42 and the signal-readout signal line 170 are electrically isolated from each other. At this point in time, the voltage of the amplification-control signal line CON3 is set to the high level to turn on the band control transistors 46. Also, in this case, the first switching element 11 in the switching circuit 20 is in an ON state, the voltage Va1 (e.g., the ground voltage GND) is applied to the other of the source and the drain of the amplifying transistor 42. As a result, the voltage of the charge accumulation portion FD (in other words, the voltage of the pixel electrode 1a) becomes equal to the reset voltage VRST. That is, the potential of the charge accumulation portion FD is initialized. In addition, for example, thereafter, the voltage of the amplification-control signal line CON3 is set to, for example, an intermediate voltage between the high level and the low level. As a result, the reset noise is reduced. In this case, when the voltage is set so that the operating band of the band control transistor 46 becomes narrower than the operating band of the amplifying transistor 42, the reset-noise reduction effect further increases. Lastly, the voltage of the amplification-control signal line CON3 is set to the low level to turn off the band control transistor 46. As a result, the reset noise is reduced, and also the potential of the charge accumulation portion FD is initialized.

In the case of the pixel 110A, in addition to setting the voltage of the amplification-control signal line CON3 to the high level, the voltage of the reset-control signal line CON2 is set to the high level to turn on the reset transistor 48, so that the voltage of the charge accumulation portion FD becomes equal to the reset voltage VRST. Next, the reset transistor 48 is turned off. In addition, for example, thereafter, when the voltage of the amplification-control signal line CON3 is set to, for example, the intermediate voltage between the high level and the low level, the reset-noise reduction effect described above is also obtained. Lastly, the voltages of the reset-control signal line CON2 and the amplification-control signal line CON3 are set to the low level to turn off the band control transistor 46A.

Next, the readout operation for outputting a signal corresponding to the signal charge accumulated in the charge accumulation portion FD will be described with reference to FIGS. 1B and 2. The control circuit causes the plurality of pixels 110 to perform the readout operation in accordance with operations below. The readout operation is performed for each row of the pixels 110.

In the readout operation, the voltage of the selection-control signal line CON7 is set to the high level to turn on the selecting transistor 44. Also, the switching circuit 20 is controlled so that the voltage of the other of the source and the drain of the amplifying transistor 42 reaches the voltage Va2 (e.g., the power-supply voltage VDD). That is, the second switching element 12 is turned on, so that the voltage Va2 is applied to the other of the source and the drain of the amplifying transistor 42. In this state, the amplifying transistor 42 and the constant-current source 144 form a source follower circuit. Then, the potential of the charge accumulation portion FD reaches a voltage corresponding to the amount of the signal charge accumulated in the charge accumulation portion FD. As a result, the voltage of the charge accumulation portion FD, the voltage corresponding to the amount of the signal charge, is amplified with an amplification factor of, for example, about 1 by the amplifier 2 and is output to the signal-readout signal line 170. In this case, the amplification factor of the source follower circuit is, for example, about 1.

This readout operation is performed in a state in which signal charge in the exposure operation is accumulated in the charge accumulation portion FD and in a state in which the reset operation is completed on the pixel 110 and the reset voltage VRST is set for the pixel electrode. A readout operation performed in a state in which the signal charge in the exposure operation is accumulated in the charge accumulation portion FD is referred to as a "signal readout operation", and a readout operation performed in a state in which the reset voltage VRST is set for the pixel electrode is referred to as a "reset-signal readout operation".

[Operations of Imaging Device]

Operations of the imaging device 100 will be described next. Specifically, a description will be given of operations that the control circuit in the imaging device 100 causes the pixels to perform.

The following description will be given of operations and a problem when an imaging device according to a comparative example is used and operations and an advantage when the imaging device 100 according to the present embodiment is used.

First, the imaging device according to the comparative example will be described with reference to FIGS. 5A, 5B, and 5C. The imaging device according to the comparative example has a configuration similar to that of the above-described imaging device 100 according to the present embodiment and differs therefrom in the operations of the individual circuits. The following description will be given of an example in which pixels 110 in the imaging device according to the comparative example constitute a pixel array of "$0^{th}$ row to $n^{th}$ row×$0^{th}$ column to $m^{th}$ column".

FIG. 5A is a timing chart illustrating one example of operations in the imaging device according to the comparative example. FIG. 5B is a flowchart illustrating one example of the operations in the imaging device according to the comparative example.

FIG. 5A illustrates a timing of a trigger signal, a timing of falling (or rising) of a vertical synchronization signal VD, time-series changes in the magnitude of a voltage applied to the counter electrode 1b (i.e., a bias voltage applied to the photoelectric conversion layer 1c) of the photoelectric converters 1, drive of all the plurality of pixels 110, a reset operation on each row of the pixel array of the pixels 110, a signal readout operation, and an exposure operation. The uppermost part in FIG. 5A illustrates a timing of a "trigger signal" for giving an instruction for starting the exposure. "VD" in the uppermost graph in FIG. 5A illustrates a timing of falling (or rising) of the vertical synchronization signal VD. The "counter electrode voltage" in the second graph from the top in FIG. 5A illustrates time-series changes in the voltage applied from the voltage supply circuit 140 to the counter electrode 1b through the accumulation control line 130. In addition, the "pixel drive" and the "operation on each row" below the "counter electrode voltage" show drive of all the pixels 110 and a timing of an operation on each row of the pixel array of the pixels 110, respectively. Each line in the "operation on each row" shows that an operation is sequentially performed from the $0^{th}$ row to the $n^{th}$ row for each row. Each solid line in the "operation on each row" shows a reset operation, and each dashed line shows a signal readout operation.

As illustrated in FIGS. 5A and 5B, a reset operation before an exposure operation needs to be first performed on all the pixels 110, and thus, in a reset operation period A, the control circuit in the imaging device according to the comparative example causes the plurality of pixels 110 in all the rows from the $0^{th}$ row to the $n^{th}$ row to perform the reset operation for at least each row (S111). During the reset operation, for example, reset noise (e.g., kTC noise) is reduced, and also the reset operation is performed, as described above.

Next, in a state in which the reset noise in all the pixels 110 is reduced, and the reset voltage VRST is set, the control circuit in the imaging device according to the comparative example applies the high voltage to the counter electrode 1b to cause the plurality of pixels 110 to perform the exposure operation in an exposure operation period B (S112). The exposure operation is performed on two or more of the plurality of pixels 110 at a time.

Next, after the exposure operation, in a signal readout operation period C, the control circuit in the imaging device according to the comparative example causes the pixels 110 belonging to all the rows from the $0^{th}$ row to the $n^{th}$ row to perform a signal readout operation for at least each row, perform, after the signal readout operation, the reset operation again on all the pixels 110 from which signals were read out, and perform, after the reset operation, the reset-signal readout operation again on all the pixels 110 (S113). In the reset-signal readout operation, in a state in which noise in all the pixels 110 from which the signals were read out is reduced, and the reset voltage VRST is set, a readout operation of the reset signals is performed for at least each row.

Thereafter, the control circuit in the imaging device according to the comparative example receives an external trigger signal, determines an exposure starting time, and causes the plurality of pixels 110 to perform a reset operation, an exposure operation, and a signal readout operation (S114 to S117). Operations that are similar to those in steps S111 to S113 are performed in steps S115 to S117. In this case, a reset operation on all the pixels 110 to be exposed is needed for at least each row in a period from when the trigger signal is received in step S114 and before the exposure operation in step S116 is performed, and thus, a long waiting time T1 occurs from when the external trigger signal is received until the exposure operation is started. For example, when a time of 3 microseconds per reset operation on one row is needed for full-high definition (FHD; vertical 1000 rows), a waiting time T1 of 3 milliseconds or more occurs, and what the user wants to photograph cannot be photographed at a timing when the user wants to photograph, or what the user wants to photograph cannot be continuously shot at a timing when the user wants to photograph. Therefore, a problem arises in that, for example, sequential inspection of a plurality of objects cannot be performed at high speed.

Figure 5C:
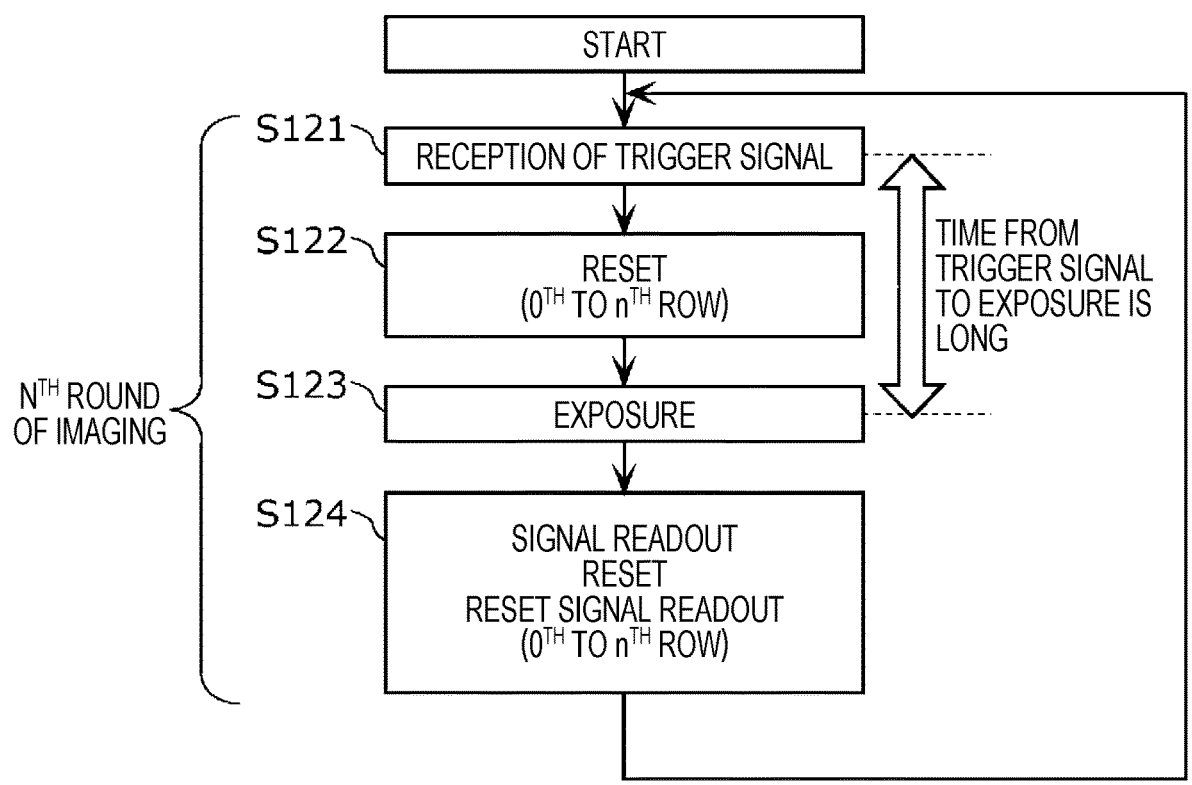
FIG. 5C is a flowchart illustrating another example in the operations in the imaging device according to the comparative example.

FIG. 5C is a flowchart illustrating another example of the operations in the imaging device according to the comparative example. In the example illustrated in FIG. 5C, the control circuit in the imaging device according to the comparative example first receives an external trigger signal and causes the plurality of pixels 110 to perform a reset operation, an exposure operation, and a signal readout operation (S121 to S124). Operations that are similar to those in steps S114 to S117 described above are performed in steps S121 to S124. The imaging device according to the comparative example may determine the exposure-operation starting time upon receiving the external trigger signal, after performing a first round of imaging in which all the rows are reset, as illustrated in FIG. 5B, or may determine the exposure-operation starting time at the beginning upon receiving the external trigger signal, as illustrated in FIG. 5C. Also, the imaging device according to the comparative example may repeat the exposure-operation timing control according to the external trigger signal and internal continuous scanning.

Next, operations of the imaging device 100 according to the present embodiment which addresses the above-described problem will be described with reference to FIGS. 6A to 7. The description below will be given of an example in which the pixels 110 in the imaging device 100 constitute a pixel array of "$0^{th}$ row to $n^{th}$ row×$0^{th}$ column to $m^{th}$ column". The imaging device 100 may include the pixels 110A or 115 instead of the pixels 110.

Figure 6A:
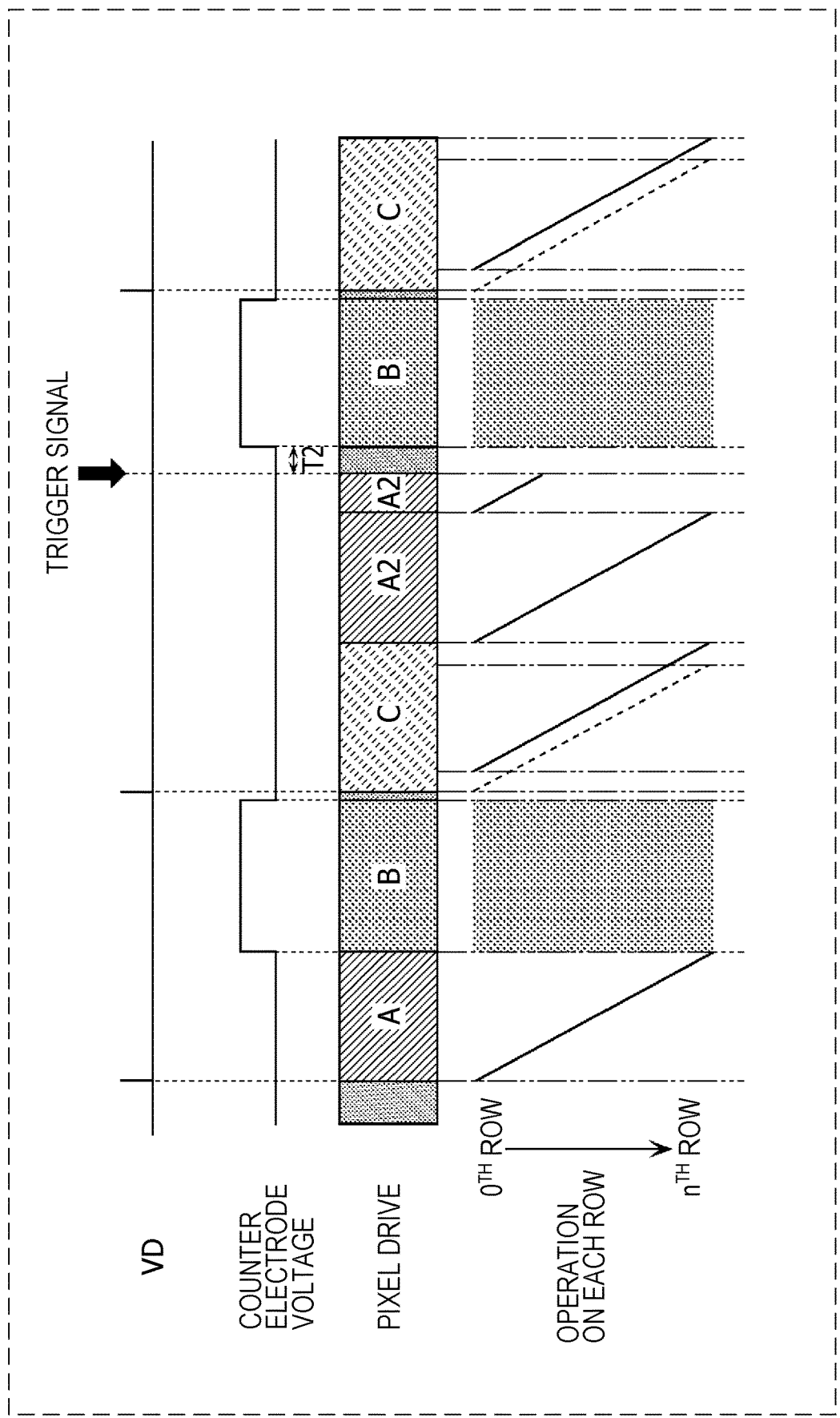
FIG. 6A is a timing chart illustrating one example of operations in the imaging device according to the first embodiment.
Figure 6B:
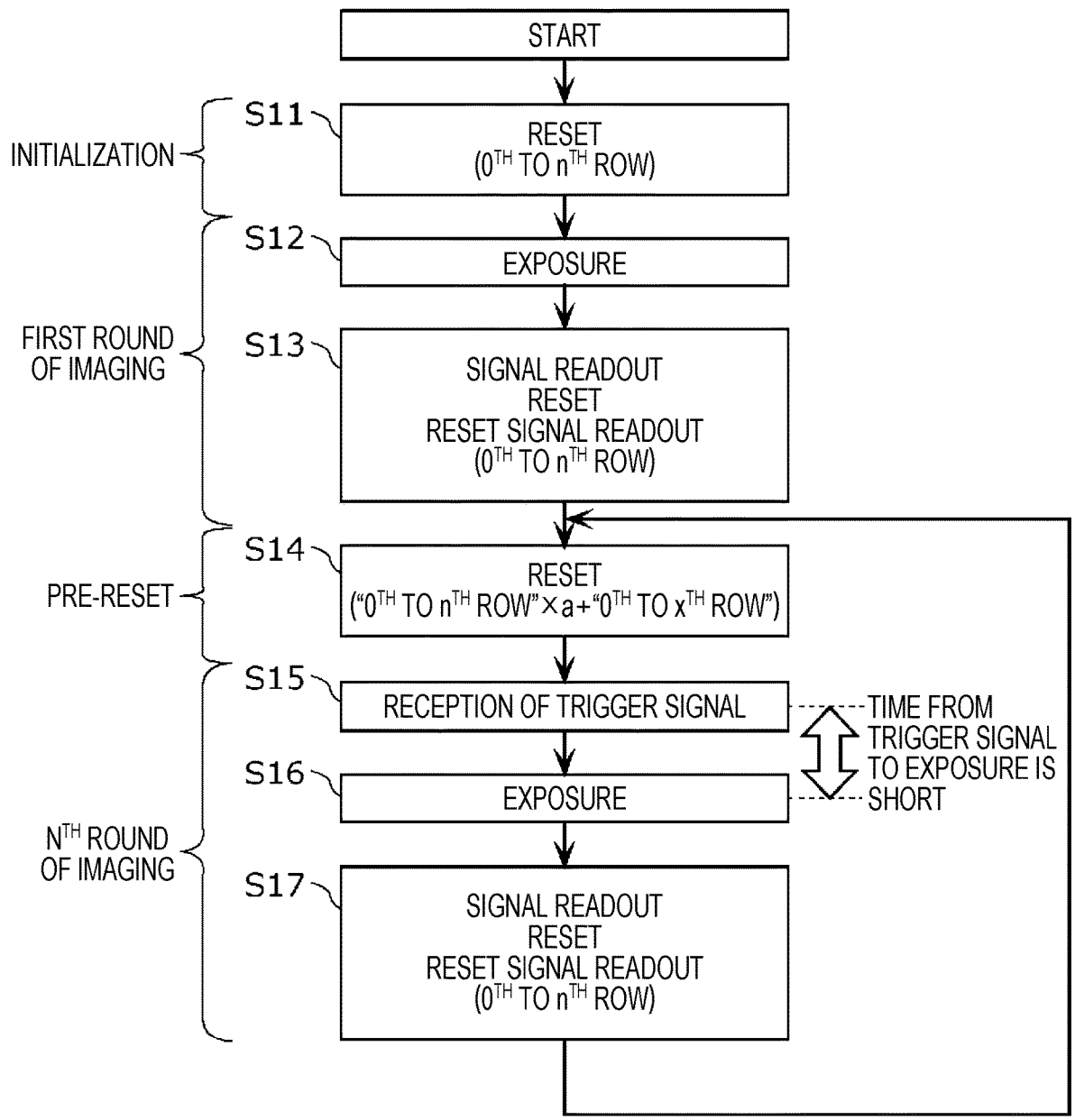
FIG. 6B is a flowchart illustrating one example of the operations in the imaging device according to the first embodiment.
Figure 6C:
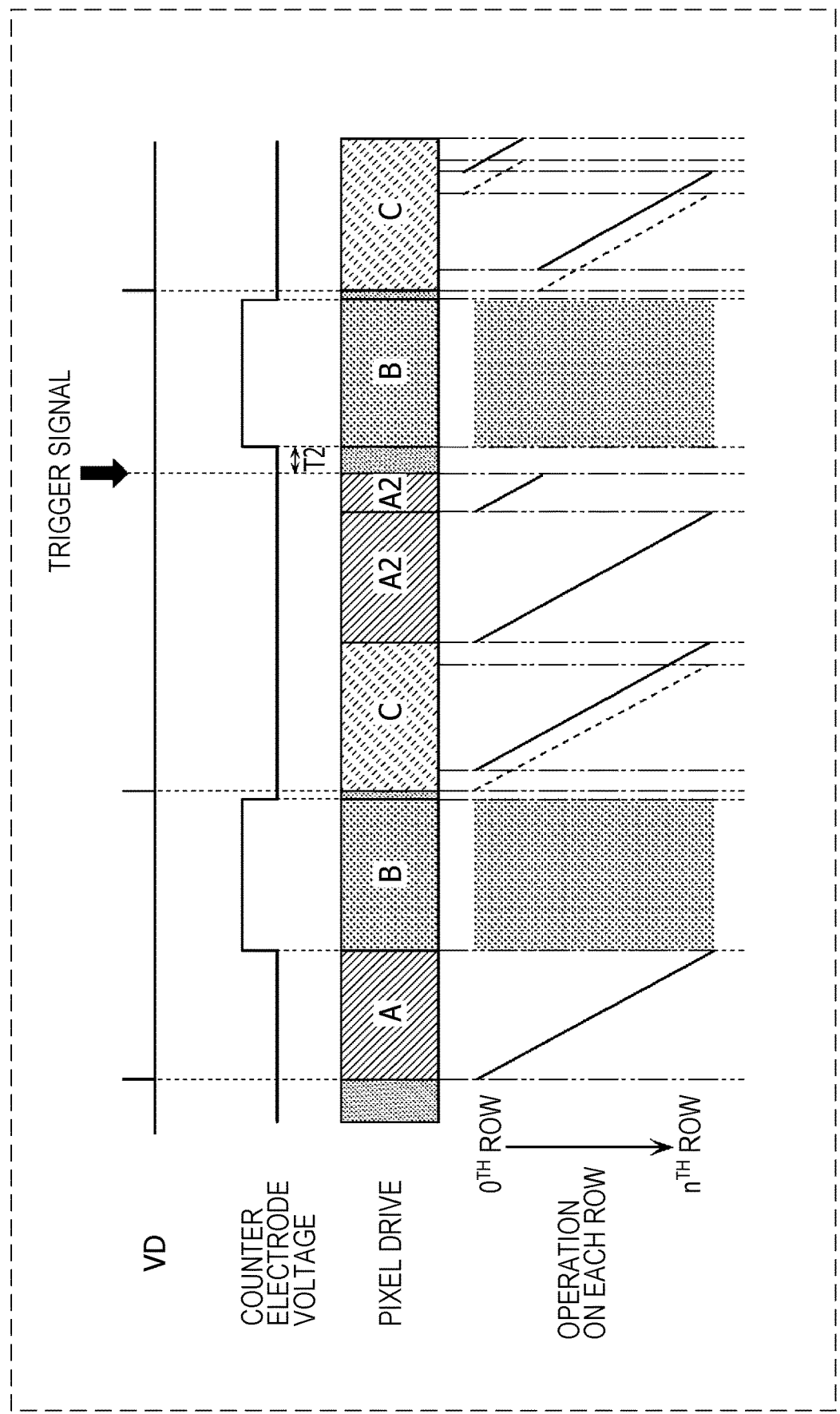
FIG. 6C is a timing chart illustrating another example of the operations in the imaging device according to the first embodiment.

FIG. 6A is a timing chart illustrating one example of operations in the imaging device 100 according to the present embodiment. FIG. 6B is a flowchart illustrating one example of operations in the imaging device 100 according to the present embodiment. FIG. 6C is a timing chart illustrating another example of the operations in the imaging device 100 according to the present embodiment.

Similarly to FIG. 5A, FIGS. 6A and 6C each illustrate a timing of a trigger signal, a timing of falling (or rising) of a vertical synchronization signal VD, time-series changes in the magnitude of a voltage applied to the counter electrode 1b (i.e., a bias voltage applied to the photoelectric conversion layer 1c) of the photoelectric converters 1, drive of all the plurality of pixels 110, a reset operation on each row of the pixel array of the pixels 110, a signal readout operation, and an exposure operation.

As illustrated in FIGS. 6A and 6B, first, in order to reset voltages in all the pixels 110 before an exposure operation, the control circuit in the imaging device 100 causes the pixels 110 in all the rows from the $0^{th}$ row to the $n^{th}$ row to perform a reset operation in a reset operation period A (S11). During the reset operation, for example, reset noise (kTC noise) is reduced, and also the reset operation is performed for at least each row, as described above. In step S11, the control circuit in the imaging device 100 may cause the pixels 110 included in the plurality of pixels 110 and belonging to at least one row to perform the reset operation for each row. For example, when imaging is to be performed in a clipping mode using some of the pixels 110, the reset operation may be performed on the rows of the pixels 110 to be used.

Next, in a state in which the reset noise in all the pixels 110 is reduced, and the reset voltage VRST is set, the control circuit in the imaging device 100 applies the high voltage to the counter electrode 1b in an exposure operation period B to cause the pixels 110 to perform the exposure operation (S12). The exposure operation is simultaneously performed on two or more of the plurality of pixels 110. The exposure operation may be simultaneously performed on all the pixels 110.

In a signal readout operation period C after the exposure operation, the control circuit in the imaging device 100 causes the pixels 110 belonging to all the rows from the $0^{th}$ row to the $n^{th}$ row to perform a signal readout operation on accumulated pixel signals for at least each row, to perform, after the readout operation, a reset operation on all the pixels 110 from which the signals were read out, and to perform, after the reset operation, a reset-signal readout operation on all the pixels 110 (S13). In the reset-signal readout operation, in a state in which noise in all the pixels 110 from which the signals were read out is reduced, and the reset voltage VRST is set, a readout operation on reset signals is performed for at least each row.

In this case, in the imaging device according to the comparative example described above, after the external trigger signal is received and before the exposure operation is performed, the reset operation for all the pixels 110 that are caused to perform the exposure operation is needed for at least each row, thus causing a problem that a long waiting time occurs from when the external trigger signal is received until the exposure operation is started. Also, a method is conceivable in which the reset operation on all the pixels 110 that are caused to perform the exposure operation is pre-performed for at least each row, independently of receiving the external trigger signal. However, when a time from when the reset operation is performed until the external trigger signal is received and further until the exposure operation is started is long, an influence of minute leakage of dark current or the like causes a problem that the signal charge accumulation and the signal readout operation cannot be accurately performed.

However, in the imaging device 100 according to the present embodiment, provision of a period (a pre-reset operation period A2) in which the reset operation for at least each row is repeated after the readout of the reset signals in step S13 makes it possible to reduce the waiting time from when the external trigger signal is received until the exposure operation is started. Specifically, in the pre-reset operation period A2, the control circuit in the imaging device 100 causes the plurality of pixels 110 to perform the reset operation for at least each row (S14). The reset operation in step S14 is repeated in units of the $0^{th}$ row to the $n^{th}$ row until the control circuit receives the trigger signal from outside (S15). That is, the control circuit in the imaging device 100 causes the plurality of pixels 110 to repeatedly perform the reset operation sequentially for each row until the trigger signal is received.

Also, upon receiving the external trigger signal in step S15, the control circuit in the imaging device 100 performs interrupt processing to cause the reset operation to be stopped up to the end of processing on the pixels 110 in an $x^{th}$ row on which the reset operation is being performed. Thus, the reset operation in step S14 is repeated in units of the $0^{th}$ row to the $n^{th}$ row "a" times and is further performed from the $0^{th}$ row to the $x^{th}$ row. In this case, "a" is an integer greater than or equal to 0. The $x^{th}$ row is one of the rows between the $0^{th}$ row and the $n^{th}$ row. As described above, in steps S13 to S15, the control circuit in the imaging device 100 causes all the pixels 110 to sequentially perform, for each row, the reset operation for initializing the potentials of the charge accumulators FD before the trigger signal for giving an instruction for starting the exposure is received. Also, the control circuit in the imaging device 100 causes the pixels 110 included in the plurality of pixels 110 and belonging to at least one row to perform the reset operation a plurality of times, until the trigger signal is received. As a result, accumulation of signal charge that derives from dark current or the like that causes noise is reduced before the control circuit receives the external trigger signal.

As soon as the reset operation is finished, the control circuit in the imaging device 100 causes two or more of the plurality of pixels 110 to perform the exposure operation (S16). Then, the control circuit in the imaging device 100 causes the plurality of pixels 110 to perform a signal readout operation, a reset operation, and a reset-signal readout operation (S17). That is, after receiving the trigger signal, without causing the pixels 110 included in the plurality of pixels 110 and belonging to at least one row to perform the reset operation, the control circuit in the imaging device 100 causes the plurality of pixels 110 to simultaneously perform the exposure operation for accumulating signal charge in the charge accumulators FD. Differences between outputs in the signal readout operation and outputs in the reset readout operation, the outputs being obtained in the manner described manner, are determined to thereby obtain signals corresponding to the amounts of charge generated by photoelectric conversion during the exposure operation. Operations that are similar to those in steps S12 and S13 described above are performed in steps S16 and S17.

After the exposure operation, in step S17, the control circuit in the imaging device 100 may cause the plurality of pixels 110 to sequentially perform, for each row, the signal readout operation from the $0^{th}$ row at which the reset operation was started in steps S11 and S13, as illustrated in FIG. 6A. When this configuration is employed, the row at which the reset operation is started and the row at which the readout operation is started become the same, thus making it possible to suppress the control circuit becoming complicated. Also, since data to be read out is temporally continuously read out from an upper row to a lower row or from a lower row to an upper row, continuity of images is maintained.

The row at which the signal readout operation is started is not particularly limited, as long as it is sequentially performed for each row of the pixels 110 belonging to all rows. For example, after the exposure operation, in step S17, the control circuit in the imaging device 100 may cause the plurality of pixels 110 to sequentially perform, for each row, the signal readout operation from a next row of the $x^{th}$ row at which the reset operation was ended in step S14, as illustrated in FIG. 6C. When this configuration is employed, the times from the reset operation to the readout operation on the respective rows become generally the same. Thus, after the reset operation is performed, differences between the amounts of charge accumulated in the charge accumulators FD in the individual rows decrease, the charge accumulation being caused by dark current or the like. Hence, differences in noise between the pixels 110 are reduced.

Then, the operations in steps S14 to S17 are repeatedly performed. In the imaging device 100 according to the present embodiment, since the pre-reset operation period A2 is provided as described above, a waiting time T2 from when the external trigger signal is received until the exposure operation is started can be reduced by an amount of time larger than or equal to the time of the reset operation on one row, compared with the above-described waiting time T1.

In this case, in the above description, in steps S14 and S15, when the external trigger signal is received, the reset operation is stopped up to the end of processing on the row on which the reset operation is being performed, but the present disclosure is not limited thereto. It is sufficient that this reset operation be executed on the pixels 110 belonging to at least one row after the external trigger signal is received, and, for example, considering stabilization of the peripheral circuitry, the reset operation may be performed on some rows from the row on which the reset operation is being performed.

Also, in the example illustrated in FIGS. 6A and 6B, in step S14 (the pre-reset operation period A2 in FIG. 6A), during the repetition of the reset operation on the rows from the $0^{th}$ row to the $n^{th}$ row which are one unit (i.e., one frame), when the reset operation on one frame is completed, the reset operation on a next frame is immediately executed from the $0^{th}$ row. That is, when the reset operation is repeated, there is no interval from when the reset operation on one frame is completed until the reset operation on a next frame is started. In step S14, a period in which the reset operation is not executed may be provided after the reset operation on one frame is completed until the reset operation on a next frame is started. Noise due to dark current is more reduced, as the period in which the reset operation is not executed in step S14 becomes shorter. The period may be set so that an image quality required for the purpose of use is obtained. For example, the period in which the reset operation is not executed in step S14 may be shorter than or equal to the length of one frame.

Also, in FIG. 6B, when the control circuit in the imaging device 100 receives the trigger signal in a period in which steps S11 to S13 are executed, that is, in a period before the reset operation is performed on all the pixels 110, the control circuit does not suspend the operations, such as the reset operation. In this case, for example, the control circuit in the imaging device 100 may discard the received trigger signal and may cause the pixels 110 to perform the exposure operation after step S13 without immediately starting the exposure operation. Also, the control circuit in the imaging device 100 may have a circuit configuration in which the trigger signal is not received in a period before the reset operation is performed on all the plurality of pixels 110.

Figure 6D:
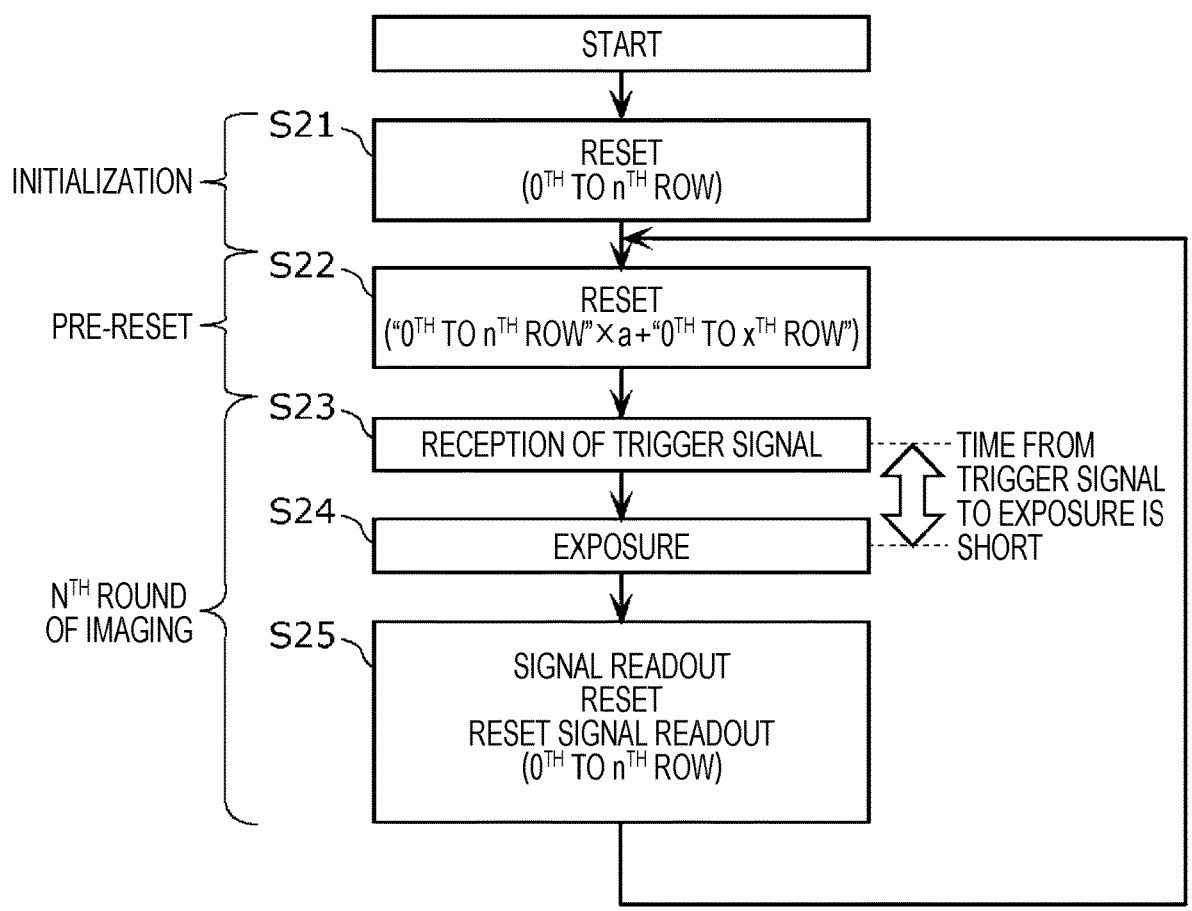
FIG. 6D is a flowchart illustrating another example of the operations in the imaging device according to the first embodiment.

FIG. 6D is a flowchart illustrating another example of the operations in the imaging device 100. In the example illustrated in FIG. 6D, the control circuit in the imaging device 100 first causes the pixels 110 belonging to all the rows from the $0^{th}$ row to the $n^{th}$ row to perform a reset operation (S21). In step S21, an operation that is similar to the operation in step S11 described above is executed. Even after the reset operation in step S21, the control circuit in the imaging device 100 causes the plurality of pixels 110 to perform a reset operation for at least each row (S22). The reset operation in step S22 is repeated in units of the $0^{th}$ row to the $n^{th}$ row until the control circuit receives a trigger signal from outside (S23). Upon receiving the trigger signal, the control circuit in the imaging device 100 causes the plurality of pixels 110 to simultaneously perform an exposure operation, as soon as the reset operation is finished (S24). Then, the control circuit in the imaging device 100 causes the plurality of pixels 110 to perform a signal readout operation, a reset operation, and a reset-signal readout operation (S25). Then, the operations in steps S22 to S25 are repeatedly executed. Operations that are similar to the operations in steps S14 to S17 described above are performed in steps S22 to S25.

The imaging device 100 may be provided with the pre-reset operation period A2 after performing a first round of imaging in which all the rows are reset and may determine the exposure-operation starting time upon receiving the external trigger signal, as illustrated in FIG. 6B, or may be provided with the pre-reset operation period A2 at the beginning and may determine the exposure-operation starting time upon receiving the external trigger signal, as illustrated in FIG. 6D. Also, the imaging device 100 may repeat the exposure-operation timing control according to the external trigger signal and internal continuous scanning.

FIG. 7 is a flowchart illustrating another example of the operations in the imaging device 100. In this example, the control circuit in the imaging device 100 causes the plurality of pixels 110 to perform operations similar to those in steps S11 and S12, illustrated in FIG. 6B, as operations in steps S31 and S32. Next, the control circuit in the imaging device 100 causes the plurality of pixels 110 to perform a signal readout operation and a reset operation (step S33). That is, in step S33, the reset-signal readout operation in step S13 illustrated in FIG. 6B is not performed. Next, the control circuit in the imaging device 100 causes the plurality of pixels 110 to perform operations similar to those in steps S14 to S16, illustrated in FIG. 6B, as operations in steps S34 to S36. Then, the control circuit in the imaging device 100 causes the plurality of pixels 110 to perform a signal readout operation and a reset operation (step S37). In step S37, operations that are similar to those in step S33 are performed. In this operation example, with respect to outputs of the signal readout operation, for example, differences from outputs corresponding to a state in which the reset voltage VRST is set are determined to thereby obtain signals corresponding to the amounts of charge accumulated in the charge accumulators FD.

Second Embodiment

A second embodiment will be described next. In the second embodiment, a description will be given of an imaging device having a stacked structure of at least two layers.

Figure 8:
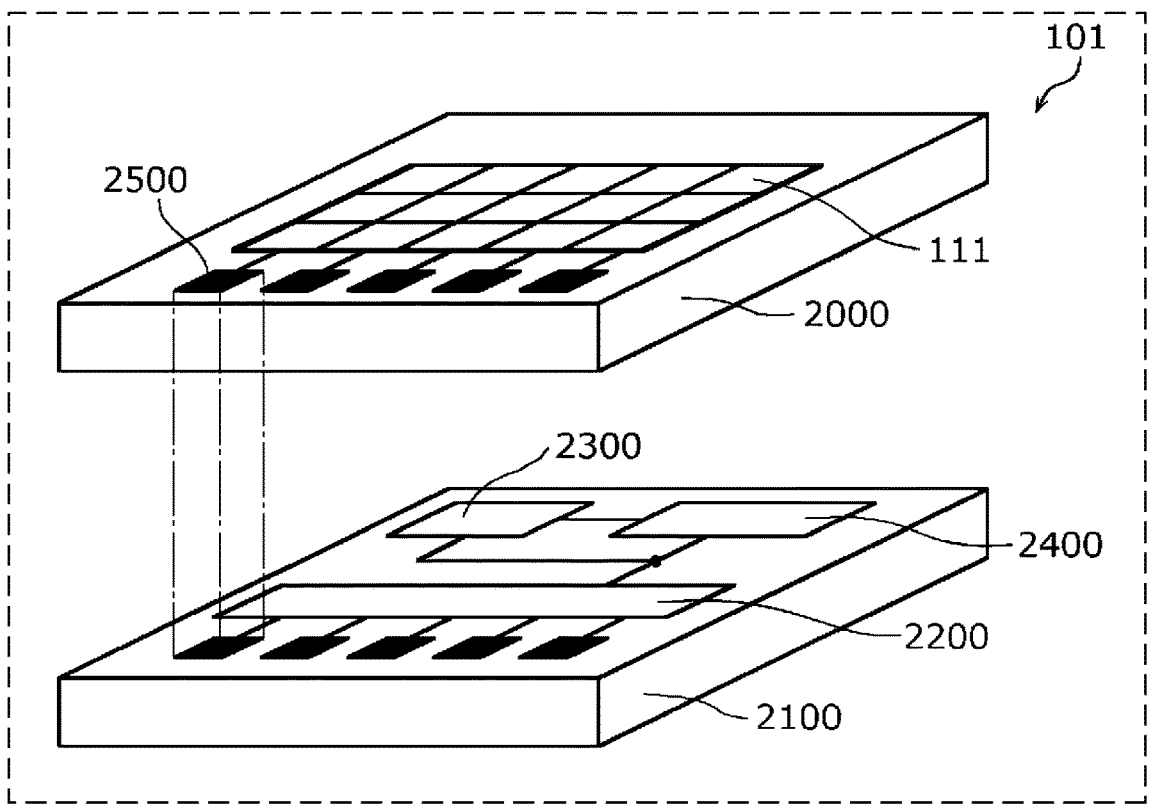
FIG. 8 is a schematic diagram illustrating one example of a configuration of an imaging device according to a second embodiment.

FIG. 8 is a schematic view illustrating one example of a configuration of an imaging device 101 according to the present embodiment. As illustrated in FIG. 8, the imaging device 101 includes a first substrate 2000 and a second substrate 2100 stacked on the first substrate 2000.

The first substrate 2000 is located above the second substrate 2100. The first substrate 2000 has a pixel array 111. The pixel array 111 has, for example, a structure in which the above-described pixels 110, 110A, or 115 are arranged in a matrix.

The second substrate 2100 has: an analog-to-digital conversion circuit (AD conversion circuit) 2200 that receives signal outputs (specifically, analog signals) from the pixels included in the pixel array 111 and that converts the signal outputs into digital signals; a memory 2400 in which the digital signals resulting from the conversion by the analog-to-digital conversion circuit 2200 are stored; and a computational processing circuit 2300 that performs computational processing on the digital signals resulting from the conversion by the analog-to-digital conversion circuit 2200.

The first substrate 2000 and the second substrate 2100 are electrically connected through connection portions 2500.

In this stack configuration, for example, the pixels 110, 110A, or 115 for realizing the above-described imaging device 100 are provided at the first substrate 2000, and a circuit for controlling the counter electrode 1b in the photoelectric converters 1 and a circuit for interrupt control logic are provided at the second substrate 2100. Since the circuit for controlling the counter electrode 1b in the photoelectric converting portion 1 and the circuit for the interrupt control logic are provided at the second substrate 2100, a circuit for free control logics can be constructed without being affected by the pixel area of the pixels included in the pixel array 111. In which of the first substrate 2000 and the second substrate 2100 each circuit is provided may be determined depending on the purpose and is not particularly limited. Specifically, for example, the pixels 110, 110A, or 115 are provided at the first substrate 2000, and the vertical scanning circuit 141, the voltage supply circuit 140, the column signal processing circuit 142, and the horizontal signal readout circuit 143 are provided at the second substrate 2100. Also, no switching circuit 20 may be included in the pixels 110, 110A, or 115, and the switching circuit 20 may be provided at the second substrate 2100. Also, no constant-current source 144 may be included in the first substrate 2000, and the constant-current source 144 may be provided in the second substrate 2100.

Although, in the example illustrated in FIG. 8, the stacked structure of the imaging device 101 is a structure in which two substrates are stacked, the stacked structure is not limited thereto. The stacked structure may be a structure in which three or more substrates are stacked or a structure in which a plurality of sub-substrates are stacked on one substrate. The connection portions 2500 for the substrates may be provided for respective columns, as illustrated in FIG. 8, may be provided for respective regions, or may be provided for the respective pixels.

Third Embodiment

Figure 9:
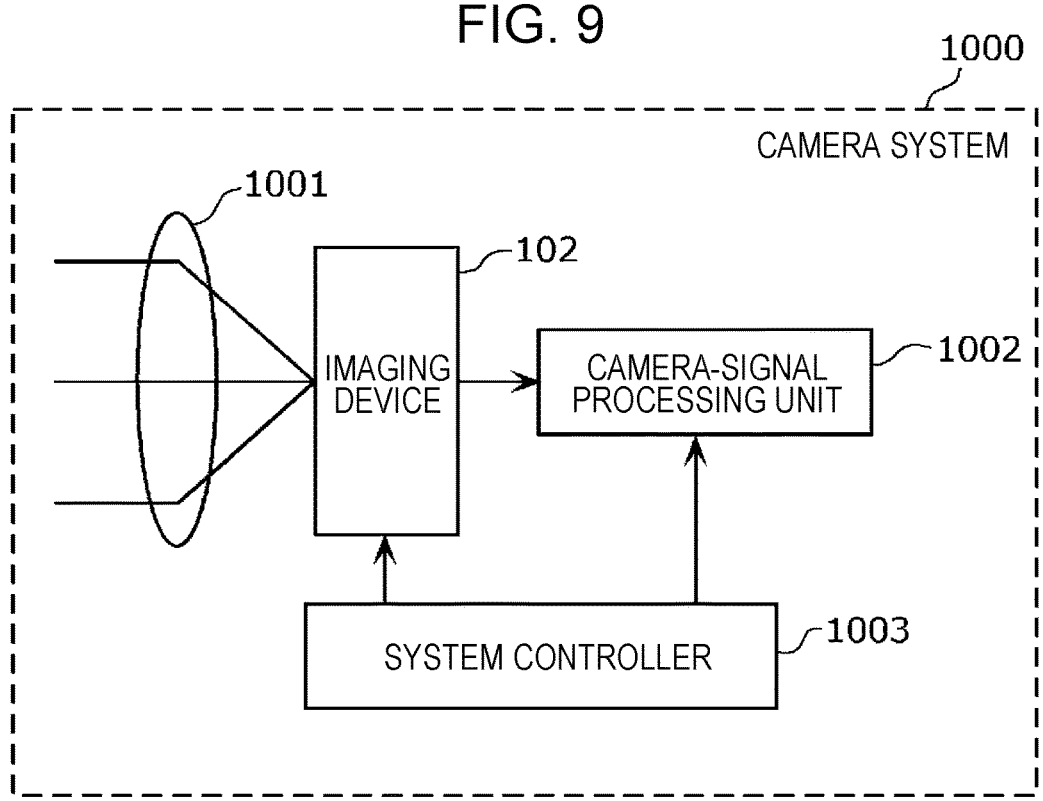
FIG. 9 is a block diagram illustrating one example of a configuration of a camera system according to a third embodiment.

A third embodiment will be described next. In the third embodiment, a description will be given of a camera system that includes the above-described imaging device. FIG. 9 is a block diagram illustrating one example of a configuration of a camera system 1000 according to the third embodiment.

The camera system 1000 according to the present embodiment includes; an imaging device 102; an optical system 1001, such as a lens, for focusing light; a camera-signal processing unit 1002 for performing signal processing on data acquired by the imaging device 102 and outputting it as an image or data; and a system controller 1003 for controlling the imaging device 102 and the camera-signal processing unit 1002.

The optical system 1001 includes a lens or the like for focusing light onto an imaging plane of the imaging device 102. Light that is transmitted through the optical system 1001 is incident on the photoelectric converters 1 in the imaging device 102 and is photoelectrically converted, so that signal charge is generated. For example, the imaging device 100 or 101 according to the embodiment described above is used as the imaging device 102.

The camera-signal processing unit 1002 functions as a signal processing circuit for processing output signals from the imaging device 102. The camera-signal processing unit 1002 performs processing, for example, gamma correction, color interpolation processing, spatial interpolation processing, automatic white balancing, distance measurement computational operation, and wavelength information separation. The camera-signal processing unit 1002 is realized by, for example, a digital signal processor (DSP).

The system controller 1003 controls the entire camera system 1000. The system controller 1003 can be realized by, for example, a microcomputer.

Since the camera system 1000 according to the present embodiment employs the imaging device 100 or 101 according to the above-described embodiment as the imaging device 102, it is possible to reduce the delay time from when the external trigger signal is received until an exposure operation on the entire light-receiving plane is started. Therefore, it is possible to provide a camera system 1000 that is high in usability, that is, that has a short waiting time until the start of the exposure operation, that can image what and when the user wants to image, or that can perform high-speed inspection.

Other Embodiments

Although the imaging device and the camera system according to one or more aspects have been described above based on the embodiments, the present disclosure is not limited to those embodiments.

For example, although, in the above-described embodiment, the reset operation in step S14 is started immediately after the operation in step S13 is finished, the reset operation may be started with an interval after the operation in step S13 is finished, as long as an image quality needed for the purpose of use is obtained.

Also, although, in the above-described embodiment, the voltages of the charge accumulators FD become equal to the reset voltage VRST in the reset operation when the charge accumulators FD are electrically connected to the switching circuits 20, the present disclosure is not limited thereto. A reference voltage may be applied from a circuit different from the switching circuits 20 to thereby perform the reset operation on the charge accumulation portion FD.

Also, although, in the above-described embodiment, the photoelectric converting portion 1 includes the pixel electrodes 1a, the counter electrode 1b, and the photoelectric conversion layer 1c, the photoelectric converting portion 1 may further include a charge transporting layer or a charge blocking layer between the photoelectric conversion layer 1c and the pixel electrodes 1a or the counter electrode 1b. With this arrangement, since generation of dark current is further reduced, noise is further reduced.

Also, a mode in which the reset operation and the signal readout operation are performed for each row has been described in the above embodiment. However, a plurality of signal lines may be provided for each column, and the reset operation and the signal readout operation may be performed for two or more rows at a time. This makes it possible to realize a high-speed operation. A configuration in which a plurality of signal lines are provided for each column is detailed in U.S. Pat. No. 10,225,500 filed by the applicant, and the entire contents of which are incorporated herein by reference.

Also, receiving the trigger signal in a period other than the pre-reset operation period is also envisaged in scenes in which the imaging device in the present disclosure is actually used. For example, when the trigger signal is received before the pre-reset operation is started, the trigger signal may also be disregarded. Alternatively, after the trigger signal is received, and the reset operation is performed on the pixels in all the rows, the exposure operation may be started. Also, for example, when the trigger signal is received during the exposure period, the trigger signal may be disregarded. Alternatively, after the exposure operation is finished, and the signal readout operation and the reset operation are performed, the exposure operation may be performed again. Alternatively, after the exposure operation is finished, and the reset operation is performed, the exposure operation may be performed again. Alternatively, after the exposure operation is suspended in the middle thereof, and the reset operation is performed, the exposure operation may be performed again. Even when an operation as described above is performed when the trigger signal is received in a period other than the pre-reset operation period, such an operation is also encompassed by the scope of rights of the present disclosure, as long as the operations disclosed in the claims of the present disclosure are performed.

In addition, modes obtained by making various modifications conceived by those skilled in the art to the embodiments and modes constructed by combining the constituent elements in different embodiments are also encompassed by the scope of the present disclosure, as long as such modes do not depart from the spirit of the present disclosure.

The imaging device according to the present disclosure can be utilized for various sensor systems and camera systems, such as digital still cameras, medical cameras, surveillance cameras, vehicle-mounted cameras, digital single-lens reflex cameras, and digital mirrorless single-lens reflex cameras.

What is claimed is:

1. An imaging device comprising:
a plurality of pixels arrayed in a matrix having rows, the plurality of pixels respectively including photoelectric converters that convert light into signal charge and charge accumulators that accumulate the signal charge; and
a control circuit configured to:
cause pixels included in the plurality of pixels and belonging to at least one row among the rows to perform, sequentially for each row at a time or sequentially for two or more rows at a time, a pre-reset operation for initializing potentials of the charge accumulators, until a trigger signal for giving an instruction for starting exposure is received,
cause, after receiving the trigger signal, the plurality of pixels to simultaneously perform an exposure operation for accumulating the signal charge in the charge accumulators without causing pixels included in the plurality of pixels and belonging to at least one row to perform the pre-reset operation, and
cause, after performing the exposure operation, the plurality of pixels to automatically perform a signal readout operation, and to automatically perform a reset operation, and a reset-signal readout operation, wherein:
the control circuit is configured to start the pre-reset operation following the reset signal readout operation and cause the pre-reset operation to be performed, without causing the reset signal readout operation to be performed immediately after the pre-reset operation, until the trigger signal for giving the instruction for starting exposure is received.

2. The imaging device according to claim 1,
wherein, until the trigger signal is received, the control circuit causes all the plurality of pixels to perform the pre-reset operation sequentially for each row at a time or sequentially for two or more rows at a time.

3. The imaging device according to claim 1,
wherein, until the trigger signal is received, the control circuit causes the pixels included in the plurality of pixels and belonging to the each row to perform the pre-reset operation a plurality of times.

4. The imaging device according to claim 1,
wherein the control circuit causes the plurality of pixels to repeatedly perform the pre-reset operation sequentially for each row at a time or sequentially for two or more rows at a time, until the trigger signal is received.

5. The imaging device according to claim 1,
wherein, after the exposure operation, the control circuit causes the plurality of pixels to sequentially perform a readout operation for outputting signals corresponding to the signal charge accumulated in the charge accumulators, the readout operation being performed for each row or for two or more rows at a time from a row at which the pre-reset operation was started.

6. The imaging device according to claim 1,
wherein the control circuit
causes the plurality of pixels to perform, sequentially for each row at a time or sequentially for two or more rows at a time, the pre-reset operation up to a row different from a row at which the pre-reset operation was started, and
causes, after the exposure operation, the plurality of pixels to sequentially perform a readout operation for outputting signals corresponding to the signal charge accumulated in the charge accumulators, the readout operation being performed for each row or for two or more rows at a time from a next row of a row at which the pre-reset operation was ended.

7. The imaging device according to claim 1,
wherein each of the plurality of pixels includes a feedback circuit for negatively feeding back a potential of the charge accumulation portion in the pre-reset operation.

8. The imaging device according to claim 1,
wherein each of the plurality of pixels includes a circuit for reducing reset noise that occurs in the pre-reset operation.

9. The imaging device according to claim 1,
wherein the pre-reset operation includes an operation for negatively feeding back the potentials of the charge accumulators.

10. The imaging device according to claim 1, further comprising:
a voltage supply circuit,
wherein each of the photoelectric converters includes a counter electrode electrically connected to the voltage supply circuit, a pixel electrode electrically connected to corresponding one of the charge accumulators, and a photoelectric conversion layer located between the counter electrode and the pixel electrode; and
the control circuit causes the voltage supply circuit to apply a voltage to the counter electrode to form an electric field in the photoelectric conversion layer to cause the plurality of pixels to perform the exposure operation.

11. The imaging device according to claim 1, wherein the control circuit further causes, after performing the exposure operation, the plurality of pixels to perform a signal readout operation and a reset signal readout operation.

12. The imaging device according to claim 1, wherein the control circuit causes, after receiving the trigger signal, the plurality of pixels to simultaneously perform the exposure operation interposing no reset operation on the plurality of pixels.

13. The imaging device according to claim 1, wherein the control circuit is configured to start the pre-reset operation continuously after the reset-signal readout operation.

14. The imaging device according to claim 1, wherein the control circuit is configured to automatically start the pre-reset operation following the reset-signal readout operation.

15. The imaging device according to claim 1, wherein pixels belonging to a row subjected to the pre-set operation are initialized by the pre-reset operation at a same time.

16. A control method for an imaging device including a plurality of pixels arrayed in a matrix having rows, the plurality of pixels respectively including photoelectric converters that convert light into signal charge and charge accumulators that accumulate the signal charge, the control method comprising:

performing, until a trigger signal for giving an instruction for starting exposure is received, a pre-reset operation for initializing potentials of the charge accumulators on pixels included in the plurality of pixels and belonging to at least one row among the rows, the pre-reset operation being performed sequentially for each row at a time or sequentially for two or more rows at a time, simultaneously performing, after the trigger signal is received, an exposure operation for accumulating the signal charge in the charge accumulators on the plurality of pixels without performing the pre-reset operation on pixels included in the plurality of pixels and belonging to at least one row, and causing, after performing the exposure operation, the plurality of pixels to automatically perform a signal readout operation, and to automatically perform a reset operation, and a reset-signal readout operation, wherein:

the control method comprises starting the pre-reset operation following the reset signal readout operation and causing the pre-reset operation to be performed, without causing the reset signal readout operation to be performed immediately after the pre-reset operation, until the trigger signal for giving the instruction for starting exposure is received.

17. The control method according to claim 16,
wherein the pre-reset operation includes an operation for negatively feeding back the potentials of the charge accumulators.

18. The control method according to claim 16, further comprising after performing the exposure operation, a signal readout operation and a reset signal readout operation on the plurality of pixels.

19. The control method according to claim 16, wherein the simultaneously performing, after the trigger signal is received, the exposure operation is carried out with interposing no reset operation on the plurality of pixels.

20. An imaging device comprising:
a plurality of pixels arrayed in a matrix having rows, the plurality of pixels respectively including photoelectric converters that convert light into signal charge and charge accumulators that accumulate the signal charge; and a control circuit configured to
cause pixels included in the plurality of pixels and belonging to at least one row among the rows to perform, sequentially for each row at a time or sequentially for two or more rows at a time, a pre-reset operation for initializing potentials of the charge accumulators, until an exposure trigger signal for giving an instruction for starting exposure is received, cause, after receiving the trigger signal, the plurality of pixels to simultaneously perform an exposure operation for accumulating the signal charge in the charge accumulators without causing pixels included in the plurality of pixels and belonging to at least one row to perform the pre-reset operation, and cause, after performing the exposure operation, the plurality of pixels to perform a signal readout operation, a reset operation, and a reset-signal readout operation without being triggered by any trigger signal issued as a result of a user operation, wherein the control circuit is configured to cause the pre-reset operation without being triggered by the any trigger signal, after the reset-signal readout operation, to be performed, without causing the reset signal readout operation to be performed immediately after the pre-reset operation, until the exposure trigger signal for giving the instruction for starting exposure is received.

* * * * *